US011453168B2

(12) United States Patent
Siyani et al.

(10) Patent No.: US 11,453,168 B2
(45) Date of Patent: Sep. 27, 2022

(54) RAPID PRODUCTION APPARATUS WITH PRODUCTION ORIENTATION DETERMINATION

(71) Applicant: Stratasys Ltd., Rehovot (IL)

(72) Inventors: Amnon Siyani, Avnei Hefetz (IL); Eliahu M. Kritchman, Tel-Aviv (IL)

(73) Assignee: Stratasys Ltd., Rehovot (IL)

( * ) Notice: Subject to any disclaimer, the term of this patent is extended or adjusted under 35 U.S.C. 154(b) by 247 days.

(21) Appl. No.: 16/858,809

(22) Filed: Apr. 27, 2020

(65) Prior Publication Data

US 2020/0254694 A1 Aug. 13, 2020

Related U.S. Application Data

(60) Continuation of application No. 15/597,204, filed on May 17, 2017, now Pat. No. 10,632,678, which is a
(Continued)

(51) Int. Cl.
| | |
|---|---|
| *G05B 19/4099* | (2006.01) |
| *B29C 64/386* | (2017.01) |
| *B29C 64/106* | (2017.01) |
| *G06F 30/00* | (2020.01) |
| *B29C 64/00* | (2017.01) |
| *B33Y 10/00* | (2015.01) |
| *B33Y 40/00* | (2020.01) |

(52) U.S. Cl.
CPC ............ *B29C 64/386* (2017.08); *B29C 64/00* (2017.08); *B29C 64/106* (2017.08); *G05B 19/4099* (2013.01); *G06F 30/00* (2020.01); *B33Y 10/00* (2014.12); *B33Y 40/00* (2014.12)

(58) Field of Classification Search
CPC ..... B29C 64/00; B29C 64/106; B29C 64/182; B29C 64/188; B29C 64/209; B29C 64/386; B33Y 10/00; B33Y 30/00; B33Y 40/00; G05B 19/4099; G06F 30/00
See application file for complete search history.

(56) References Cited

U.S. PATENT DOCUMENTS

| | | | |
|---|---|---|---|
| 5,263,130 A | 11/1993 | Pomerantz et al. | |
| 5,402,351 A | 3/1995 | Batchelder et al. | |
| (Continued) | | | |

FOREIGN PATENT DOCUMENTS

| | | |
|---|---|---|
| WO | WO 95/05943 | 3/1995 |
| WO | WO 2008/107866 | 9/2008 |

OTHER PUBLICATIONS

Communication Relating to the Results of the Partial International Search dated Nov. 10, 2008 From the International Searching Authority Re.: Application No. PCT/IL2007/000286.
(Continued)

*Primary Examiner* — Yuhui R Pan

(57) ABSTRACT

A method of producing an object by sequentially printing layers of construction material one on top of the other, the method comprising: providing the construction material at a first lower temperature; flowing the construction material through a heated flow path in a flow structure to heat the construction material and delivering the heated construction material to a heated reservoir in a printing head; and dispensing the heated construction material from the reservoir to build the object layer by layer.

17 Claims, 20 Drawing Sheets

Related U.S. Application Data continuation of application No. 14/330,073, filed on Jul. 14, 2014, now Pat. No. 9,662,834, which is a continuation of application No. 13/541,811, filed on Jul. 5, 2012, now Pat. No. 8,781,615, which is a division of application No. 12/529,377, filed as application No. PCT/IL2007/000286 on Mar. 7, 2007, now Pat. No. 8,219,234.

(56) References Cited

U.S. PATENT DOCUMENTS

| | | | |
|---|---|---|---|
| 5,491,643 | A | 2/1996 | Batchelder |
| 5,506,607 | A | 4/1996 | Sanders, Jr. et al. |
| 5,622,216 | A * | 4/1997 | Brown .................. B33Y 30/00 164/71.1 |
| 6,129,872 | A | 10/2000 | Jang |
| 6,813,594 | B2 | 11/2004 | Guertin et al. |
| 6,907,307 | B2 | 6/2005 | Chen et al. |
| 7,403,833 | B2 | 7/2008 | Heide et al. |
| 8,781,615 | B2 | 7/2014 | Kritchman et al. |
| 2002/0008335 | A1 | 1/2002 | Leyden et al. |
| 2002/0079601 | A1 | 6/2002 | Russell et al. |
| 2002/0188369 | A1 | 12/2002 | Guertin et al. |
| 2004/0006405 | A1 | 1/2004 | Chen et al. |
| 2004/0141018 | A1 | 7/2004 | Silverbrook |
| 2006/0155418 | A1 | 7/2006 | Bradbury et al. |
| 2007/0233298 | A1 | 10/2007 | Heide et al. |
| 2012/0267827 | A1 | 10/2012 | Kritchman et al. |
| 2014/0319716 | A1 | 10/2014 | Shtilerman |
| 2017/0246851 | A1 | 8/2017 | Kritchman et al. |

OTHER PUBLICATIONS

International Preliminary Report on Patentability dated Sep. 17, 2009 From the International Bureau of WIPO Re.: Application No. PCT/IL2007/000286.
International Search Report and the Written Opinion dated Mar. 26, 2008 From the International Searching Authority Re.: Application No. PCT/IL2007/000286.
Notice of Allowance dated Mar. 13, 2012 From the US Patent and Trademark Office Re. U.S. Appl. No. 12/529,377.
Notice Of Allowance dated Jan. 26, 2017 From the US Patent and Trademark Office Re. U.S. Appl. No. 14/330,073. (5 pages).
Notice Of Allowance dated Dec. 2019 From the US Patent and Trademark Office Re. U.S. Appl. No. 15/597,204. (3 pages).
Official Action dated Jan. 3, 2019 From the US Patent and Trademark Office Re. U.S. Appl. No. 15/597,204. (15 pages).
Official Action dated Apr. 17, 2019 From the US Patent and Trademark Office Re. U.S. Appl. No. 15/597,204. (14 pages).
Official Action dated Jul. 20, 2016 From the US Patent and Trademark Office Re. U.S. Appl. No. 14/330,073.
Official Action dated Dec. 22, 2016 From the US Patent and Trademark Office Re. U.S. Appl. No. 14/330,073. (7 pages).
Official Action dated Sep. 25, 2013 From the US Patent and Trademark Office Re. U.S. Appl. No. 13/541,811.
Official Action dated Jul. 30, 2019 From the US Patent and Trademark Office Re. U.S. Appl. No. 15/597,204. (13 pages).
Restriction Official Action dated Dec. 13, 2011 From the US Patent and Trademark Office Re. U.S. Appl. No. 12/529,377.
Allen et al. "Determination and Evaluation of Support Structures in Layered Manufacturing", Journal of Design and Manufacturing, 5: 153-162, 1995.
Choi et al. "Modelling and Optimisation of Rapid Prototyping", Computers in Industry, 47: 39-53, 2002.
Choi et al. "Visualisation of Rapid Prototyping", Rapid Prototyping Journal, 7(2): 99-114, 2001.
Danjou et al. "Determination of Optimal Build Direction for Different Rapid Prototyping Applications", 14emes Assises Europeennes du Ptototypage & Fabrication Rapide, Paris, France, Jun. 24-25, 2009, p. 1-9, 2009.
Ma et al. "An Adaptive Slicing and Selective Hatching Strategy for Layered Manufacturing", Journal of Materials Processing Technology, 89-90: 191-197, 1999.
Yang et al. "Determining Build Orientation for Layer-Based Machining", The International Journal of Advanced Manufacturing Technology, 18: 313-322, 2001.
Yang et al. "Minimizing Staircase Errors in the Orthogonal Layered Manufacturing System", IEEE Transactions on Automation Science and Engineering, 2(3): 276-284, Jul. 2005.

* cited by examiner (202)

(206)

(220)

(221,222)

(222)

(222,223)

(210)

(210)

(210)

(211,212)

(212)

(212)

RAPID PRODUCTION APPARATUS WITH PRODUCTION ORIENTATION DETERMINATION

RELATED APPLICATIONS

This application is a continuation of U.S. patent application Ser. No. 15/597,204 filed on May 17, 2017, which is a continuation of U.S. patent application Ser. No. 14/330,073 filed on Jul. 14, 2014, now U.S. Pat. No. 9,662,834, which is a continuation of U.S. patent application Ser. No. 13/541,811 filed on Jul. 5, 2012, now U.S. Pat. No. 8,781,615, which is a division of U.S. patent application Ser. No. 12/529,377 filed on Apr. 11, 2010, now U.S. Pat. No. 8,219,234, which is a National Phase of PCT Patent Application No. PCT/IL2007/000286 having International Filing Date of Mar. 7, 2007. The contents of the above applications are all incorporated herein by reference.

FIELD OF THE INVENTION

The present invention relates to apparatus, hereinafter "rapid production apparatus", (RPA) for producing a 3-dimensional object by sequentially forming thin layers of material, one on top of the other, responsive to data defining the object.

BACKGROUND OF THE INVENTION

Rapid production apparatus (RPAs) form objects by sequentially forming thin layers, hereinafter "construction layers", of construction material one on top of the other responsive to data, hereinafter "construction data", defining the objects. There are numerous and varied types of RPAs and different methods by which they form the thin construction layers from which they build an object.

One type of RPA, conventionally referred to as an "ink-jet RPA", "prints" each layer of an object it builds. To form a given layer, the ink-jet RPA controls at least one dispenser, referred to as a "printing head", to dispense at least one construction material (CM), hereinafter a "building material" (BM), in liquid form in a pattern responsive to construction data for the object and then solidifies the dispensed material. Generally, the layer is printed in the shape of a cross section of the object. Building material in adjacent, contiguous construction layers is printed in the shape of thin cross sections of the object that are displaced relative to each other by a small incremental distance along a same direction, hereinafter referred to as a "stacking direction", relative to the object. The incremental distance is generally equal to the thickness of the layers.

For convenience of exposition, the cross sections of the object in whose shapes the construction layers are formed are assumed to be parallel to the xy-plane of a suitable coordinate system and the stacking direction is in the z-direction of the coordinate system. Optionally, the building material is a photopolymer, which is hardened after dispensing by exposure to suitable electromagnetic radiation, typically UV radiation.

For many construction objects, because of the complexity and/or shape of the objects, construction layers comprising only BM printed in the shape of cross sections of the construction objects are not completely self-supporting and require support during construction of the object. For such cases, at least one additional construction material CM, hereinafter referred to as "support material" (SM) is printed as required in suitable regions of each layer, to provide support for the building material in following layers. The support material and/or a shape in which it is formed, is such that upon completion of the object it can be removed from the object without substantially damaging the building material. In some embodiments, the support material, like the building material, is also a photopolymer.

An ink-jet type of RPA typically comprises at least one ink-jet printing head comprised in a "printing head block" that is mounted to a "shuttle". Each printing head has an array of one or more output orifices and is controllable to dispense construction material, BM and/or SM, from each orifice independently of dispensing construction material from the other orifices. The construction material generally comprises one or more types of photopolymer materials typically stored in at least one supply cartridge. A suitable configuration of pipes and pumps transports the material or materials from the at least one supply cartridge to one or more reservoirs in the printing head block from which the at least one ink-jet printing head receives the construction material. Optionally, to maintain appropriate viscosity of the at least one photopolymer, a controller controls at least one heater, optionally mounted to the printing block, printing head and/or reservoir, to heat the photopolymer to a suitable operating temperature. The one or more types of photopolymers may, generally, be dispensed in any combination, separately or together, simultaneously or consecutively.

During construction of an object, a controller controls the shuttle to repeatedly move over a support surface, hereinafter a "construction platform", parallel to the x-y plane on which the object is formed by the RPA. The support surface and shuttle are generally housed in an at least partially enclosed "construction hangar" that protects the object while it is being built. As the shuttle moves, the controller controls each printing head to dispense construction material selectively through its orifices responsive to construction data defining the object, to print one construction layer of the object on top of the other on the construction platform.

Optionally, in moving the shuttle over the support surface during production of a construction layer, the controller controls the shuttle to move back and forth along a "scanning direction" conventionally defined as the x-direction. Optionally, at any one or more reversals of the shuttle along the x-direction, the controller increments displacement of the shuttle in a direction perpendicular to the scanning direction, in a direction referred to as "displacement" direction, conventionally the y-direction. Following production of a given construction layer, either the construction platform is lowered or the shuttle raised, along the stacking direction by a distance equal to a thickness of a next construction layer to be produced over the just formed given layer.

Mounted to the shuttle, adjacent to the printing head block are one or more sources of electromagnetic radiation, optionally UV radiation, for curing the photopolymer construction material printed in each construction layer. Also, optionally, mounted to the shuttle adjacent to the at least one printing head block is a "leveling roller" which levels newly printed layers of construction material to a predetermined layer height by removing surplus material from the layer. The surplus material removed from the layer is wiped off the roller by a "cleaning wiper" and gathered in a waste container comprised in the shuttle. Alternatively, the support surface moves.

Configurations of ink-jet type RPAs are described in U.S. Pat. No. 6,193,923 (Leyden), U.S. Pat. Nos. 6,259,962, 6,658,314, 6,569,373, 6,850,334 and U.S. applications Ser.

Nos. 10/716,426, 10/336,032 and PCT Publication WO 2004/096527, the disclosures of which are incorporated herein by reference.

SUMMARY OF THE INVENTION

An aspect of some embodiments of the invention, relates to providing improved control of dispensing BM and/or SM material by a printing head in the RPA by providing improved control of the temperature of dispensed material.

Temperature of a BM or SM material dispensed by a printing head tends to decrease as a rate at which the printing head dispenses the material increases, because a time period available to a conventional RPA heater to bring the material to a desired temperature decreases as dispensing rate increases. The temperature decrease in general adversely affects viscosity of the material and thereby its ability to flow and form a homogenous, quality construction layer that bonds properly to adjacent construction layers. If dispensing rates vary during production of an object or objects, it is generally difficult to compensate for reduced heating time by controlling temperature of the heaters.

In accordance with an embodiment of the invention, an RPA is provided with a heating unit hereinafter referred to as a "flow-heater" or "pre heater" that substantially reduces dependence of temperature at which BM or SM is dispensed by its printing head on a rate at which the material is dispensed. In accordance with an embodiment of the invention, the flow-heater comprises a heat sink having a relatively large thermal capacity that is formed with an internal flow channel through which material dispensed by the printing head flows to reach the reservoir in the printing head. A heating element provides heat to the heat sink to maintain the temperature of the heart sink at a temperature at which it is desired that the BM or SM should be dispensed. The flow channel is made sufficiently long so that for a range of material dispensing rates at which the RPA operates, during passage of the material through the channel, temperature of the material equalizes to that of the heat sink. In some embodiments of the invention a pre heater is supplemented or replaced by a flow-heater that heats the BM or SM material after it leaves the reservoir.

An aspect of some embodiments of the invention relates to a method and apparatus for removing finished objects from an RPA construction platform.

In general, before beginning construction of an object (or objects), an RPA lays down a "foundation" on the RPA construction platform. The object is then built by depositing layers of BM or SM on the foundation and planning off the deposited layers with an RPA leveling roller. The foundation provides a relatively accurately planar surface parallel to the x-y motion of the RPA printing head block on which to build the object and provides material between the object and the surface of the construction platform that enables the object to be scraped off the construction platform without damaging the object. Conventionally, each finished object is removed by scraping and/or peeling the foundation off the construction platform using a conventional scraping tool such as a paint scraper. Whereas to save construction costs and time it is advantageous for the foundation to be as thin as possible, the foundation is formed sufficiently thick so that it and the object may be scraped or lifted off the construction platform without damage to the object.

In accordance with an embodiment of the invention, a "spatula shovel" is provided for removing finished objects from the construction platform. The spatula shovel comprises a relatively thin plate formed with a straight, relatively sharp leading edge and optionally has a length and width substantially equal respectively to the length and width of the construction platform. Optionally, the structural shape of the spatula is reinforced by upturned edges. The sharp front edge of the spatula shovel is forced between the foundation and the construction platform to peel and/or scrape and lift off the foundation and finished objects from the construction platform and functions as a support and carry tray for the objects once they are lifted off the construction platform. The leading edge is sufficiently sharp and the plate sufficiently thin yet rigid so that the objects are relatively easily removed without damage.

The inventors have found that using a spatula shovel in accordance with an embodiment of the invention to remove finished objects from a construction platform generally enables the objects to be removed more easily and with less chance of damage than by using a conventional scraping tool. As a result, a foundation on which objects are formed may be made substantially thinner than conventional foundations. The thinner foundation provides savings in production materials and object production time. An aspect of some embodiments of the invention relates to providing different production modes for an object printed by the RPA so that a user of the RPA can tailor production time and quality of an object to the user's needs.

In accordance with an embodiment of the invention, an RPA is configured to operate selectively in different production modes chosen from a plurality of production modes. Optionally, the plurality of production modes comprises three production modes: a draft mode, a standard mode and a high quality mode. For each of the different production modes, production parameters that determine RPA operation and affect quality and rate of production of an object are adjusted as required to assume values that correspond to the production mode and are compatible with each other.

Cost of an object produced by an RPA depends upon amounts of material used in producing the object and its production time. Whereas, in general there is little control over an amount of BM required to produce an object, because the amount is determined by the object's volume, an amount of SM required to produce the object depends, in general, upon the object's orientation on the RPAs production platform.

An aspect of some embodiments of the invention relates to providing an algorithm for determining orientation of an object to be built on an RPA construction platform in order to reduce an amount of SM used in its production.

Production time of an object or objects is a function, inter alia, of a number of scan passes, i.e. passes along, optionally, the scanning, x-direction, that the shuttle makes in order to produce the object or objects, and the lengths of the scan passes. The number and lengths of the scan passes are functions of orientation and relative position of the objects on the construction platform.

An aspect of some embodiments of the invention relates to a method for determining relative orientation of objects to be built by an RPA, and relative position of the objects on the RPAs construction platform in order to reduce the number and lengths of scan passes used to produce the objects.

Hereinafter, an orientation on an RPA construction platform of a single object to be produced by the RPA and a configuration of orientations and relative positions of a plurality of objects to be produced on the RPA construction platform are referred to as "build configurations".

An aspect of some embodiments of the invention relates to providing methods of calibrating a printing head block so that CM material is accurately deposited at desired locations during production of an object.

To control CM deposition so that the CM is deposited accurately at desired locations during production of an object, position of an RPA shuttle during its motion along scanning and displacement directions should accurately be known and timing of activation of printing heads mounted in the shuttle to dispense CM material should accurately be coordinated with the shuttle motion and position. In accordance with an embodiment of the invention, calibration is performed to determine if printing heads are misaligned relative to each other and/or to scanning and displacement directions and to correct and/or compensate for misalignment. In an embodiment of the invention, calibration is performed responsive to at least one test pattern printed by the RPA. Optionally, the at least one test pattern comprises a plurality of straight lines.

Optionally a determined misalignment is corrected, at least in part, by mechanically realigning the printing head and/or the printing head block in which it is mounted and/or the shuttle that comprises the printing head block. Optionally, misalignment is compensated for, at least in part, by adjusting relative timing of command signals transmitted to at least one printing head to control dispensing material from an orifice or orifices of the at least one printing head.

There is thus provided, in accordance with an embodiment of the invention, a method of producing an object by sequentially printing layers of construction material one on top of the other, the method comprising:

providing the construction material at a first lower temperature;

flowing the construction material through a heated flow path in a flow structure to heat the construction material and delivering the heated construction material to a heated reservoir in a printing head; and dispensing the heated construction material from the reservoir to build the object layer by layer.

Optionally, the method includes controlling one or more of the flow rate and the temperature of the flow structure to provide a desired temperature of construction material to the reservoir.

In an embodiment of the invention, the temperature and length of the flow structure is high enough so that the temperature of the construction material leaving the reservoir remains substantially constant up to a flow rate of at least 5 gm/sec. Optionally, the temperature of the construction material leaving the reservoir remains substantially constant up to a flow rate of at least 5 gm/sec.

Optionally, the method providing a controller that controls the temperature of the flow structure such that the temperature of the flow structure changes with flow rate to assure the substantial constancy of the temperature of construction material leaving the reservoir.

Optionally, the method forming the flow path as a channel in a heat sink heated by a heater. Optionally, the at least one channel is spiral shaped.

In an embodiment of the invention, the flow path is provided as a meandering path at least a portion of which is heated.

In an embodiment of the invention, the flow path is located inside the reservoir. Optionally, the heating unit of the flow path is mounted to the reservoir. Optionally the heating units of the flow path and of the reservoir are the same unit.

There is further provided, in accordance with an embodiment of the invention, apparatus for producing an object by sequentially printing thin layers of a construction material one on top of the other in a stacking direction, the apparatus comprising:

at least one printing head arranged for relative motion with respect to a surface on which the object is to be constructed and having orifices from which the construction material is dispensed to print the layers;

a controller having a plurality of selectable operation modes;

an interface configured to receive input indicating a selected operation mode and transmit data indicating the selection to the controller; wherein the controller controls the relative motion and/or the operation of the at least one printing head and/or the layer thickness responsive to the selected operation mode.

Optionally, the production modes comprise at least two of draft, standard and high quality production modes.

Optionally the controller sets at least one production parameter that affects production to satisfy a specification of the selected production mode. Optionally, the at least one production parameter comprises at least one of: a rate of depositing construction material; scanning velocity; UV power for curing construction material; flow rate of air for cooling deposited construction material; construction layer thickness.

There is further provided, in accordance with an embodiment of the invention, a method for producing an object by sequentially printing thin layers of construction material the layers being printed one on top of the other in a stacking direction on a surface of a construction platform, the method comprising:

adding support construction for supporting down facing facets of the object;

orienting the object in respect to the construction platform in a way that the volume of supporting structure is minimum, and printing the object on the platform so that it is oriented in the determined build configuration.

In an embodiment of the invention, the orientation of minimum support is approximated by the orientation of lowest center of mass of the object in respect to the construction platform Optionally, orientation of minimum support is approximated by:

orienting the object on the platform at a first orientation a;

rotating the object about an X axis by + and −90° and denoting those orientations as orientations b and c respectively;

rotating the object from orientation a about a Y axis by + and −90° and denoting those orientations as orientations d and e respectively;

rotating the object from orientation a about Y axis+180° and denoting that orientation as orientation f;

computing the volume of supporting structure for each of orientations a to f;

determining the orientation for placement of the object on the platform as one of orientations a through f requiring minimum support.

There is further provided, in accordance with an embodiment of the invention, a method for producing an object by sequentially printing thin layers of build material, the layers being printed one on top of the other in a stacking direction on a surface of a construction platform, the method comprising:

determining a plurality of surface vectors each of which is perpendicular to a surface region of the object;

defining groups of surface vectors for which an angle between any two vectors in the group is less than a predetermined maximum angle;

defining for each group of surface vectors a group vector having a magnitude equal to a sum of the absolute values of the surface vectors in the group and a direction substantially parallel to at least one of the surface vectors;

determining a production orientation of the object responsive to the group vectors; and printing the object on the platform so that it is oriented in the determined production orientation.

Optionally, the predetermined maximum angle is less than or equal to about 1° or about 5°.

In an embodiment of the invention, printing comprises depositing construction material in a first pass parallel to a scanning direction and, as required, in an additional pass parallel to the first pass and displaced therefrom along a displacement direction.

In an embodiment of the invention, determining the production orientation comprises orienting the object so that a maximum group vector is parallel to one of the three directions: scanning (X), displacement (Y), and stacking (Z). Optionally, the method includes orienting the object so that a next largest vector is parallel to one of the rest of X, Y, Z directions.

There is further provided, in accordance with an embodiment of the invention a method for producing an object by sequentially printing thin layers of build material, the layers being printed one on top of the other in a stacking direction on a surface of a construction platform, the method comprising determining a production orientation for the object for which a rectangular parallelepiped having a volume that just contains the object and for which each face of the parallelepiped is perpendicular to one of the stacking, scanning and displacement directions, has a minimum volume.

In an embodiment of the invention, the method includes:

determining a coordinate system fixed to the object and having axes parallel to the stacking, scanning and displacement directions; and orienting the object in a plurality of different orientations for which each axis is parallel to one of the stacking, scanning and displacement directions.

Optionally, building the objects includes adding supporting structure, and determining for each of the plurality of orientations an amount of support material required to produce the object in the orientation. Optionally, the method includes determining the production orientation to be that orientation of the plurality of orientations, for which support material is a minimum.

There is further provided, in accordance with an embodiment of the invention, a method of simultaneously producing a plurality of objects by sequentially printing thin layers of construction material one on top of the other in a stacking direction Z on a surface of a construction platform, the method comprising:

determining a build configuration for producing the objects which defines a position and orientation of each of the objects on the platform; and producing the objects by printing layers of construction material, each layer being printed in a series of scans along a scanning direction and being mutually displaced in a direction Y;

wherein at least two said scan series have different positions of the scans in the Y direction responsive to the layer Y geometry.

Optionally, at least three layers are produced using scan series having different positions of scans in the Y direction.

Optionally, the method includes determining a position for an object such that the object's projection on the Y-Z plane is included in the sum of the projections of previously placed objects on the Y-Z plane. Optionally, the method includes determining a position for an object comprising:

determining the projection on the Y-Z plane of the object;

ordering the objects responsive to the dimensions of their Y-Z projections.

Optionally, the method includes determining a position for an object, such that the object's projection on the Y-Z plane includes the sum of the projections of previously placed objects on the Y-Z plane.

There is further provided, in accordance with an embodiment of the invention, a method of calibrating a rapid production apparatus comprising a printing head block mounted with a plurality of printing heads, each having an array of orifices equally spaced along a respective printing head axis, from which orifices construction material is deposited and wherein the arrays are parallel to each other and construction material is printed during motion of the block along a scanning x-direction, the method comprising:

first printing at least one dot of material from at least one orifice of one of the printing heads;

then printing a second at least one dot of material from an orifice of a same or different printing head;

determining a distance between the two at least one dots;

adjusting or calibrating the apparatus responsive to the distance.

Optionally, the distance is less than 5 mm.

Optionally, the dots are printed on a transparent substrate.

Optionally, the two heads are different from each other, the distance is measured along X direction, and the distance is used to calibrate the jetting X distance between said heads.

Optionally, the distance is measured along the X direction, and the distance is used to aligning the head's block so that the heads are substantially parallel to Y axis.

In an embodiment of the invention the two heads are the same head, where the first at least one dot is jetted by one of the lower nozzles of the head and the second at least one dot is jetted by one of the upper nozzles of the head, where between the first and second jetting of the two at least one dots the block is moved along the indexing Y direction. Optionally, the distance is measured along Y direction, and the distance is used to calibrate Y movement.

In an embodiment of the invention, the first at least one dot is jetted by one head and the second at least one dot is jetted by a second head, where between the first and second jetting of the two at least one dots the block is moved along the scanning X direction, where said distance is measured along Y direction, and the distance is used to aligning the head's block so that the heads are substantially perpendicular to X axis.

There is further provided, in accordance with an embodiment of the invention, a method of removing an object produced by the layer wise laying down of construction material on a construction platform, the construction material being laid down on a thin base of material, the method comprising:

providing a shovel having a flat lifting surface at least as wide as an extent of the object along the base;

sliding the flat surface under the object, while keeping the flat surface parallel to the construction platform; and lifting the object from the construction platform.

Optionally, at least a portion of the base is lifted together with the object.

Optionally, the flat surface is less than 1 mm thick.

Optionally, the shovel is formed with stiffening edges.

Optionally, the flat surface is formed with a feathered leading edge. Optionally, the feathered leading edge is composed of one single slope from the upper surface of said flat surface to the lower surface of the flat surface.

There is further provided, in accordance with an embodiment of the invention, a method of simultaneously producing a plurality of objects by sequentially printing thin layers of construction material one on top of the other in a stacking direction Z on a surface of a construction platform, the method comprising:

determining a build configuration for producing the objects which defines a position and orientation of each of the objects on the platform; and producing the objects by printing the construction material in a first pass parallel to a scanning direction X and, as required, in an additional pass parallel to the first pass displaced therefrom along a displacement direction Y so that each object is in the position and orientation of the build configuration;

wherein the Y coordinate of at least one pass on one layer is different from that of any of the passes on a lower layer.

Optionally, objects having a requirement for printing upper layers are so aligned that a minimum number of passes is required to print the upper layers.

BRIEF DESCRIPTION OF THE SEVERAL VIEWS OF THE DRAWINGS

Non-limiting examples of embodiments of the present invention are described below with reference to figures attached hereto, which are listed following this paragraph. In the figures, identical structures, elements or parts that appear in more than one figure are generally labeled with a same symbol in all the figures in which they appear. Dimensions of components and features shown in the figures are chosen for convenience and clarity of presentation and are not necessarily shown to scale.

DESCRIPTION OF SPECIFIC EMBODIMENTS OF THE INVENTION

Figure 1A:
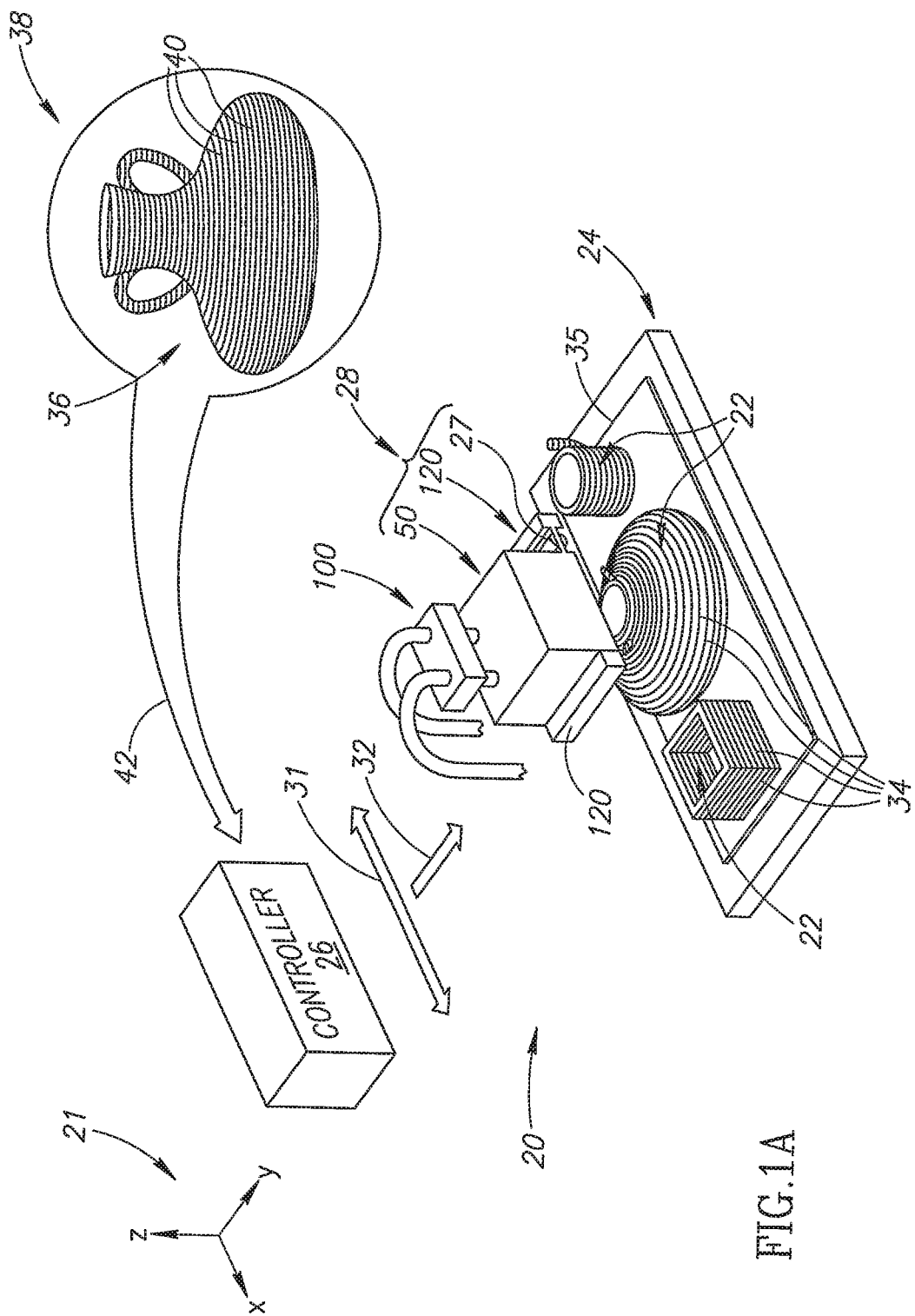
FIG. 1A schematically shows a rapid production apparatus (RPA) in accordance with an embodiment of the present invention.

FIG. 1A schematically shows an ink-jet RPA 20 producing one or more objects 22, on a construction platform 24, in accordance with an embodiment of the invention. By way of example, objects 22 comprise three objects: a hollow box, a vase and a cup, which are shown partially constructed in FIG. 1A.

RPA 20 comprises a controller 26 and a shuttle 28 comprising a printing head block 50, a leveling roller 27 and, optionally, two sources 120 of radiation suitable for polymerizing photopolymer CM used by the RPA to construct objects. Printing head block 50 comprises at least one ink-jet printing head (not shown in FIG. 1A), optionally having a plurality of output orifices configured in a linear array. The at least one printing head is controllable to dispense, i.e. print, construction material CM, e.g. build material BM and/or support material SM, from each of its orifices independently of dispensing construction material from the other orifices. Optionally, photopolymers used by RPA 20 are UV curable and radiation sources 120 are UV lamps. Optionally, only the build material is curable and the support material is a hot melt material. Optionally, construction platform 24 is mounted to a support structure or table and is controllable to be lowered and raised with respect to the support structure or table and thereby with respect to shuttle 28 using any of various methods known in the art. RPA 20 is shown very schematically and only features and components of the RPA germane to the discussion are shown in FIG. 1A. A coordinate system 21 is used to reference locations and positions of features and components of RPA 20.

To produce objects 22, controller 26 first controls shuttle 28 to move over construction platform 24 parallel to the x-y plane. While the shuttle is in motion, the controller controls the printing heads in printing head block 50 to dispense and lay down, i.e. print, on platform 24 a plurality of optionally SM construction layers to form a foundation 35 on platform 24 that is accurately planar and parallel to the x-y plane on which to build each object 22. Optionally a single large foundation is built on which to construct the objects. Optionally, a plurality of foundations, which may comprise a different single foundation for each object, is built. By way of example and for convenience, FIG. 1 shows a single large foundation 35 on platform 24 on which objects 22 are built.

Optionally, in printing construction layers, controller 26 controls shuttle 28 to move back and forth parallel to a scanning direction, optionally parallel to the x-axis, in directions indicated by a double-headed block arrow 31. Following one or more reversals of direction along the x-axis, the controller, as needed, advances shuttle 28 along a displacement direction indicated by a block arrow 32, optionally, parallel to the y-axis. Optionally, printing head block 50 is stationary and platform 24 moves in the x and y directions to scan the objects 22 with respect to head 50.

After construction material is freshly dispensed to form a region of a given construction layer (or the entire layer) in foundation 35 leveling roller 27 (or other leveling device as known in the art) contacts the region, and in accordance with any of various methods known in the art flattens and levels it to a desired thickness by shaving off or otherwise removing an upper portion of the printed material. The material in the freshly dispensed and leveled layer is then hardened by curing with UV light from UV lamps 120. Optionally, the construction material is partially hardened before leveling. After foundation 35 is formed, the controller controls shuttle 28 to move over construction platform 24 to dispense, level and cure construction material, BM, and/or support material, SM, as required and form construction layers 34 that are used to produce objects 22 on the foundation.

Construction layers in foundation 35 and construction layers 34 are stacked in a direction, i.e. a stacking direction perpendicular to construction platform 24 and parallel to the z-axis. Following formation of a given construction layer 34, optionally, construction platform 24 is lowered by a distance substantially equal to a thickness of a next construction layer to be formed on the given construction layer. For convenience of presentation, thickness of construction layers 34 is greatly exaggerated in FIG. 1A. Typically, construction layers 34 are between 8 and 60 micrometers thick.

Construction layers 34 are produced responsive to digital construction data configured in any of various formats, for example three-dimensional SLA, known in the art. By way of example, the vase being constructed by RPA 20 is a copy of a vase 36 shown in an inset 38, which is defined by digital construction data. Inset 38 schematically shows vase 36 formed from "data cross-section" layers 40 that are defined by the vase's construction data. RPA 20 forms construction layers 34 in the vase being produced on platform 24 responsive to data cross-section layers 40. The data cross-section layers are optionally defined by controller 26 from the digital construction data that defines vase 36 or are already defined by the construction data. A block arrow 42 schematically indicates that the construction data is input to controller 26 and suitably processed by the controller to control production of construction layers 34.

In order for CM material printed by printing heads in printing head block 50 to flow properly and form a homogeneous layer of material that bonds properly to a layer on which it is deposited, the CM must in general be maintained at an appropriate dispensing temperature. Dispensing temperatures for common construction materials CM vary between about 60° C. and 80° C. Conventionally, a suitable supply system provides relatively cold, generally room temperature (or somewhat heated to facilitate flow) CM to shuttle 28 and its printing head block 50, and heaters mounted to the printing head block, in the printing heads and/or in a reservoir in the printing head block, are used to control CM dispensing temperature. However, during production of an object or objects such as objects 22, under conditions for which a CM dispensing rate may undergo substantial changes, it can be difficult to maintain a desired dispensing temperature using a conventional configuration of heaters. A rate at which RPA 20 dispenses a CM may vary from a relatively low rate close to zero to a relatively high rate of about 0.4 or about 0.5 gr/s.

In general there is a relatively large mass of CM in the reservoir. When the flow rate is relatively low, the heater of the reservoir is sufficient to keep the temperature within an optimal range. However, when the flow rate from (and to) the reservoir is increased the temperature of the CM in the reservoir goes down and can fall below the optimal range. Increasing the power input into the reservoir is not a practical solution to this problem since the thermal coupling of the heater and the bulk of the fluid in the reservoir is not sufficient.

Figure 1B:
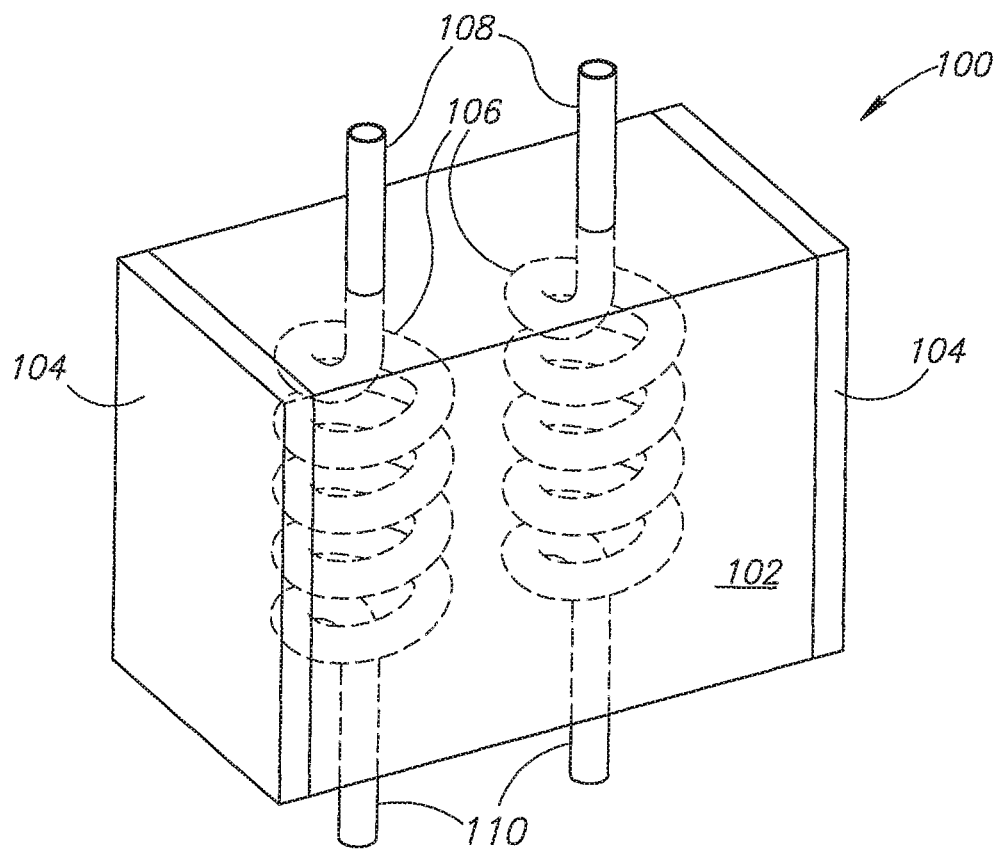
FIG. 1B schematically shows a flow-heater which can be incorporated in the RPA shown in FIG. 1A, in accordance with an embodiment of the present invention.
Figure 1C:
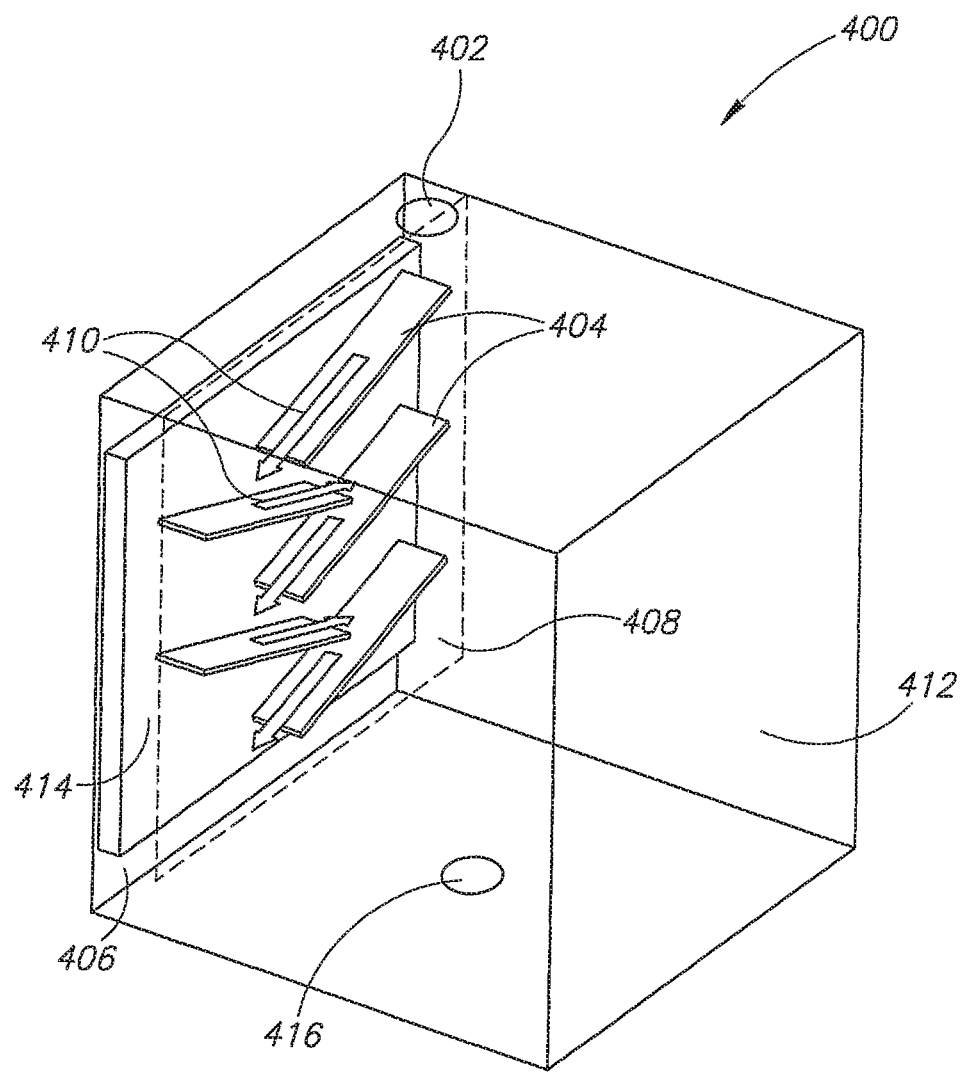
FIG. 1C schematically shows a CM reservoir including a flow-heater comprised in a printing head block, in accordance with an embodiment of the invention.
Figure 1D:
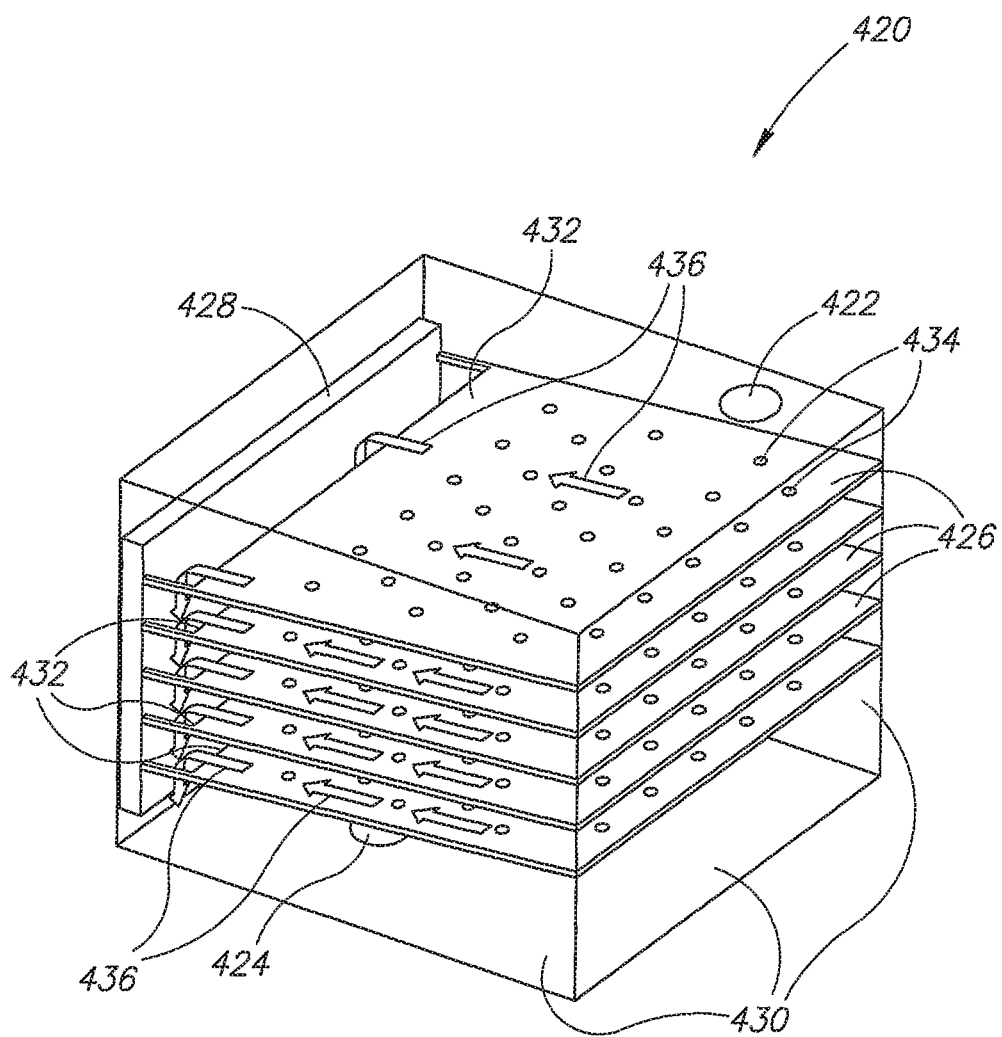
FIG. 1D schematically shows another CM reservoir in accordance with embodiments of the invention.

In accordance with an embodiment of the invention, to provide desired control of the dispensing temperature of construction material CM during production, RPA 20 is equipped with at least one heating unit, i.e. a flow-heater 100, optionally mounted to shuttle 28. Flow-heater 100 operates to control temperate of CM dispensed by RPA 20 at a desired temperature for substantially all rates at which printing heads in shuttle 28 dispense CM. Details of suitable, non-limiting examples of suitable flow heaters, in accordance with embodiments of the invention, are shown in FIGS. 1B-1D. It should be understood that flow heaters according to some embodiments of the invention differ from the heating of reservoirs according to the prior art, in that the flow heaters of the present embodiments provide a more intimate transfer of heat to the flowing material, which enables better control of the heating of the flow material.

The position of a suitable flow-heater 100, in accordance with an embodiment of the invention, is shown in FIG. 1A. The internal structure is shown schematically shown in FIG. 1B.

Flow-heater 100 comprises a heat sink 102 having relatively large thermal capacity and thermal conductivity made from a suitable material such as aluminum and at least one heating element 104 controllable to provide heat that maintains the temperature of the heat sink at a desired temperature. By way of example, heat sink 102 is shown as a rectangular block of material and at least one heating element 104 is shown as two heating elements, each covering a face of the heat sink. Heat sink 102 is formed with at least one relatively long and optionally narrow internal flow channel 106 shown in dashed lines. Optionally, in order to provide at least one flow channel 106 with a desired length, to enable efficient heat transfer to the flowing material, the flow channel is spiral shaped. By way of example, heat sink 102 is formed with two flow channels 106.

Controller 26 (FIG. 1A) controls a suitable supply system to provide relatively cold, generally room temperature CM to each flow channel 106 optionally via an input pipe 108 so that the CM passes through the flow channel to enter shuttle 28, optionally via an exit pipe 110. Optionally a different CM flows through each channel 106 (e.g. BM may flow through one channel and SM through the other). Dimensions of channels 106 are configured so that the CM maintains thermal contact with heat sink 102 for a relatively long transit time in flowing through the flow channel to shuttle 28. During the transit time, the CM absorbs heat from heat sink 102 so that upon exit from the heat sink its temperature is substantially that of the desired temperature at which the heat sink is maintained by heating elements 104. In accordance with an embodiment of the invention, the length of at least one flow channel 106 is sufficiently long and its internal width sufficiently small so that for substantially all rates at which printing heads in shuttle 28 dispense CM, the CM is heated by flow-heater 100 to the temperature at which heat sink 102 is maintained. By way of numerical example, each channel 106 may be about 150 mm long and have a cross section diameter of about 4 mm.

Alternatively or additionally, when the flow channel is not sufficiently long, the temperature of the heat sink is adjusted based on the flow rate, with a higher temperature being provided to compensate for the fact that heat transfer per unit volume of the fluid is reduced when the flow increases. Thus for relatively low flow rates the heat sinks may be heated to the same temperature as the CM in the reservoir, or even turned off. For higher flow rates, the heat sink is heated to a higher temperature, such that even in the limited time available in which the CM flows through the flow-heater, the CM reaches a temperature at or near that of the CM in the reservoir. In general, the temperature of the CM leaving the flow heater should be high enough (preferably as high as required at the outlet of the fluid reservoir) so that the reservoir heater can heat it to a proper operating temperature before dispensing it. This principle is preferably followed for each of the embodiments shown.

If flow-heater 100 is used to control dispensing temperature for a single CM, or different CMs having a same dispensing temperature, controller 26 controls heating elements 104 to maintain the temperature of heat sink 102 at the dispensing temperature. After the CM exits flow-heater 100 it enters a reservoir or reservoirs (not shown) in printing head block 50 which optionally have conventional heaters (not shown) that function to maintain the CM dispensing temperature. If flow-heater 100 is used to control temperature of different CMs having different dispensing temperatures (for example, SM may require a dispensing temperature of about 60° C. and BM a temperature of about 70° C.), controller 26 controls heaters 104 to maintain the temperature of heat sink 102 at about the lowest of the dispensing temperatures. The conventional heaters (of the reservoirs) function to raise the temperatures of the CM or CMs having the higher dispensing temperatures to their respective dispensing temperatures.

FIG. 1A shows preheater 100 and head block 50; both are separate from each other and therefore connected by two pipes, which enable the material flow between said two components. The preheater and the block may, however, being firmly connected, for example by having the two components being manufactured as a cast of the same metal body, and the heat transfer between the two components may be large respectively. In that case, a single heating and control device, which heats up the common optionally metal body to a common temperature, may serve for both components.

In some embodiments of the invention, a CM reservoir in an RPM printing head block comprises internal components that function to provide improved control of dispensing temperature of a CM so that the CM is supplied to printing heads at a desired dispensing temperature substantially independent of a rate at which the CM is supplied from the reservoir. The components cooperate to provide a relatively long flow path inside the CM reservoir for CM flowing through the reservoir. The flow path maintains the CM in thermal contact with a heating element maintained at the desired dispensing temperature for a sufficient time so that the CM is heated to the desired dispensing temperature substantially independent of a flow rate of the CM through the reservoir.

FIG. 1C schematically shows a CM reservoir 400 comprised in a printing head block (not shown), in accordance with an embodiment of the invention. CM flows into reservoir 400 at an inlet 402. Upon entering reservoir 400, the CM encounters a series of baffles 404 mounted between a wall 406 of the reservoir and a plate 408 that constrains the CM to flow between the wall and the plate along the baffles as indicted by block arrows 410 to enter a "holding volume" 412 of the reservoir.

At least one heating element maintained at a desired dispensing temperature of the CM is mounted, optionally inside reservoir 400, to wall 406 and/or plate 408. By way of example, a planar heating element 414 is mounted to wall 406. The "baffle path" created by baffles 404 along which the CM flows in order to enter holding volume 412 of reservoir 400 maintains CM that enters inlet 402 in thermal contact with heating element 406 long enough so that by a time it enters holding volume 412, the CM is heated to its desired dispensing temperature substantially independent of a rate at which the CM exits the holding volume via an outlet 416.

In some embodiments of the invention outlet 416 is placed closer to plate 408. In others is placed between heater 414 and plate 408 and plate 408 is longer and connected to the bottom (base) plate of reservoir 400, in that case an aperture is formed in plate 408 near the bottom plate and far from outlet 416, to connect the main reservoir to the volume between heater 414 and plate 408. In this embodiment, the heating of the material is carried out mainly in the volume between heater 414 and plate 408 and the main function of the main reservoir is to reduce the effect of changes in height of the material as material is added via entrance 402 and removed via outlet 416. The present inventors have found that changes in height of the material can change the flow rates of material from outlet 416. Using the larger reservoir as ballast reduces any such effects.

Optionally plate 408 is a good conductor of heat so that heat from heating element 414 flows into holding volume 412 to maintain CM in the holding volume at the desired dispensing temperature. In an embodiment of the invention, plate 408 is constructed so that a region of the plate close to inlet 402 is a poor conductor of heat or is insulated to prevent heat transfer through the upper region and the rest of the plate is a good heat conductor. The heat insulating portion of plate 408 prevents relatively cold CM just entering inlet 402 from absorbing heat from CM already in holding volume 412 while the portion of plate 408 that is a good conductor enables CM newly heated by heating element 414 to "share" heat from heating element 414 with CM in the holding volume. Optionally, plate 408 is also heated.

Configurations of baffles and baffle paths and heating elements different from that shown in FIG. 1C may be advantageous in the practice of the invention. FIG. 1D schematically shows another CM reservoir 420 comprising a baffle path in accordance with an embodiment of the invention.

Reservoir 420 comprises a least one inlet 422 through which CM enters the reservoir, a least one outlet 424 from which CM is supplied to printing heads in an RPA such as RPA 20 (FIG. 1) and optionally parallel baffle plates 426 that are tilted downward towards a heating element 428. Each baffle plate 426 is connected to three walls 430 of the reservoir along three of the edges of the baffle plate. A fourth edge 432 of each baffle plate is spaced from heating element 428. Reservoir 420 is fillable with CM through inlet 432 so that the CM fills the reservoir and the spaces between baffle plates 426. To enable CM to fill the spaces between baffle plates 426, the baffle plates are optionally formed with relatively small apertures 434 that allow air to escape the spaces during filling of the reservoir. Due to the limited contact of CM with heater 428 it may be advantageous to heat plates 426.

CM flows out of reservoir 420 to printing heads via outlet 424. When flowing out of the reservoir, substantially all CM flows along directions indicated by block arrows 436 and maintains contact with heating element 428 until it reaches the bottom of the reservoir and exits through outlet 424. Because of the relatively small size of air apertures 434 relatively little of the CM flows out of the reservoir via the apertures 434 and avoids contacting heating element 428. Contact of the CM with heating element 428 operates to keep CM flowing out of reservoir 420 at a desired dispensing temperature. The heating element is maintained at a suitable temperature so that for an operating range of CM flow rates out of reservoir 420, CM flowing out of the reservoir contacts the heating element for a sufficient time so that its temperature is substantially equalized to that of the desired dispensing temperature. Assuming that the lower section of the reservoir is thermally isolated from the surrounding, the heated liquid is then maintained at the operating temperature in the lower section of reservoir 420.

When objects 22 are completed, they are removed from production platform 24 by separating foundation 35 from the construction platform. As indicated above, in the prior art, the objects were removed by using a scraper to separate object 22 and foundation 35 from the construction platform. Since the scraping of the foundation from the construction platform tends to cause bending of the object, especially when the scraper is not parallel to platform 24, the foundation had to be made thick enough to avoid excess stress on object 22. Typically, the prior art foundation was in the range of 2-5 mm thick.

Figure 2:
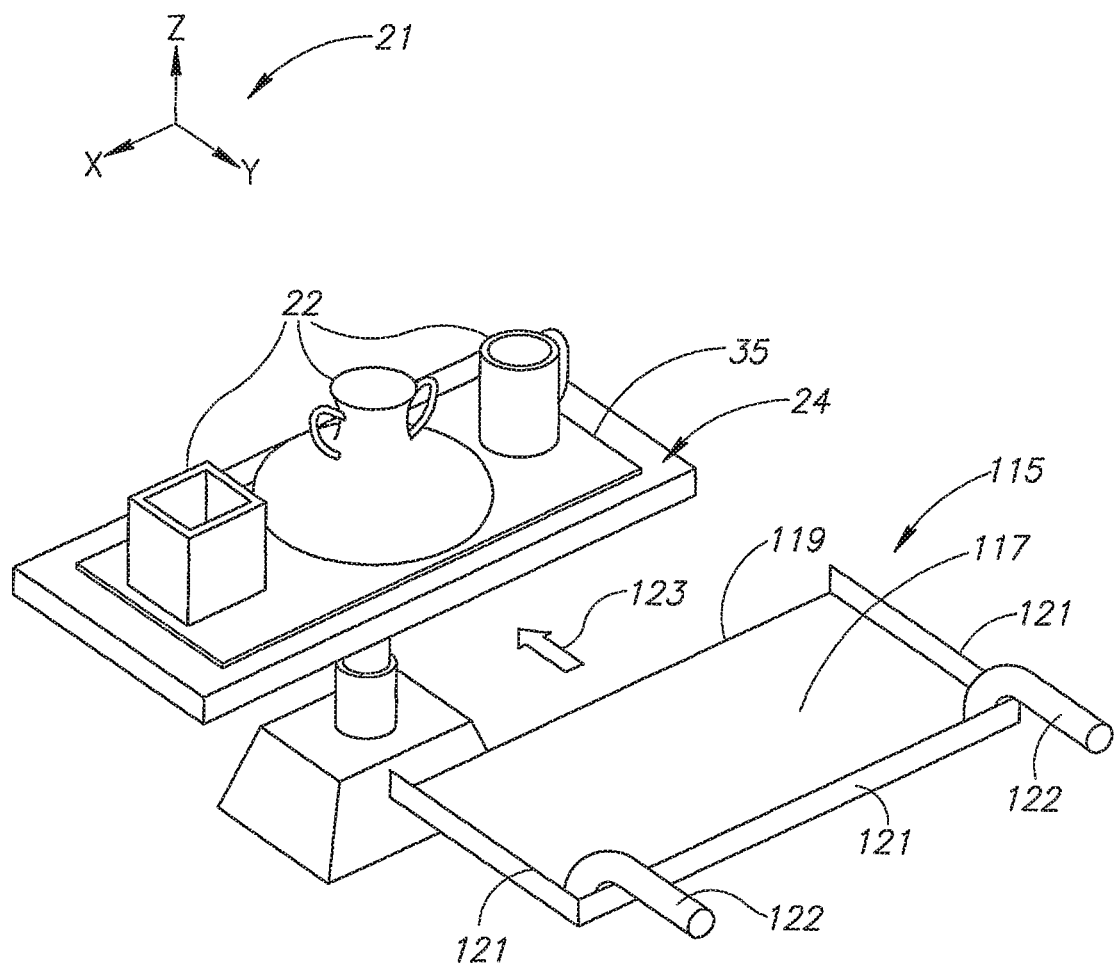
FIG. 2 schematically shows a spatula shovel being used to remove objects from a construction platform, in accordance with an embodiment of the invention.

In accordance with an embodiment of the invention, foundation 35 is separated from construction platform 24 using a spatula shovel 115 schematically shown in FIG. 2, which figure also schematically shows the platform with objects 22 completed.

Spatula shovel 115 comprises a relatively thin flat plate 117 having a length and width substantially the same as that of the top surface of construction platform 24 or at least as wide as foundation 35, a relatively sharp front "knife edge" 119 and optionally upturned side and back edges 121. Optionally, spatula shovel 115 comprises handles 122. Plate 117 is formed thinner than the scraping blades of conventional scrapers and is advantageously formed from sheet metal such as steel. Preferably, plate 117 has a thickness in a range from about a few tenths of a mm to about 0.5 mm. Upturned edges 121 serve to provide structural strength for the plate. "Knife edge" 119 is optionally manufactured so that the upper side of the edge is a slope but the lower edge is flat. When the spatula is moved into the foundation, the friction of the foundation with the edge forces the edge in the direction of construction platform 24 because of said slope of the edge. This prevents collision of the knife with the object above the foundation even when the spatula is parallel or close to being parallel to the platform.

As indicated above, the prior art provides a relatively thick platform so that the object could be removed using a knife or small spatula or the like such that the object would be protected from stress during removal. In accordance with various embodiments of the present invention, a relatively wide spatula, having a width at least as large as the object that is to be removed is used. Optionally, the spatula is thin (or at least has a thin leading edge) so that the spatula can be slid under the (thinner) platform without over stressing the object. As opposed to the prior art method in which the object is lifted as the knife or spatula is forced under the platform, in accordance with an embodiment of the invention, the spatula is kept substantially parallel to the production platform during removal of the object.

To remove objects 22 from construction platform 24, front edge 119 is pressed to foundation 35 in a direction indicated by a block arrow 123 with the sharp edge oriented so that it substantially contacts the surface of the construction platform. The force with which front edge 119 is pressed to foundation 35 forces the front edge between the foundation and construction platform 24 to peel and/or scrape and lift the foundation off the construction platform 24, and with the foundation, objects 22, without substantially bending the foundation. After separating foundation 35 and objects 22 from construction platform 24, the foundation and objects rest on flat plate 117 and spatula shovel 115 functions as a carrying tray for the objects.

In order to moderate probability of damage to finished objects resulting from using prior art scrapers to separate a foundation on which the finished objects are produced from an RPA construction platform, foundations are typically formed about 2 mm thick. The inventors have found that using a "thin" spatula shovel similar to spatula shovel 115, to remove objects from a construction platform, in accordance with an embodiment of the invention, enables foundations such as foundation 35 and the objects formed thereon to be removed relatively easily and safely from the construction platform. As a result, foundations may be made thinner, optionally less than 1 mm thick and as thin as about 0.3 mm, leading to savings in production time and cost.

For example, assume construction platform 26 is about 40 cm wide and about 50 cm long. If foundation 35 is about 2 mm thick and has length and width about the same as that of construction platform 26, the foundation has a volume of about 400 cm$^2$. Support material from which foundation 35 is optionally formed typically has a specific gravity of about 1 g/cm$^2$ and may cost about $150/kg, resulting in a material cost for the foundation of about $60. Assuming that a construction layer formed by RPA 20 is about 16 microns thick and takes about 25 seconds to print, it takes about 50 minutes to produce a conventional foundation 35. Foundation 35 formed with the expectation that it will be separated from construction platform 24 using a spatula shovel in accordance with an embodiment of the invention may be made, for example, at a thickness of 0.5 mm noted above and therefore at one fourth the material cost and one fourth the production time of a conventional foundation. It is noted that whereas FIG. 2 schematically shows foundation 35 as a single large foundation on which all of objects 22 are built, in some embodiments of the invention each object 22 is built on its own relatively small "island foundation" formed on construction platform 24. Building objects on relatively small island foundations can result in saving foundation material and can make removing objects after they are built easier.

Quality of objects such as objects 22 produced by RPA 20 depends, inter alia, upon how accurately CM is dispensed at locations at which it is desired to dispense the CM. Generally, a printing head block, such as printing head block 50 comprises a plurality of printing heads, each having a linear array of equally spaced output orifices through which CM is dispensed. Accurate orientation and positioning of the printing heads relative to each other and to scanning and displacement directions of shuttle 28 are advantageous for providing accurate dispensing of CM.

Figure 3:
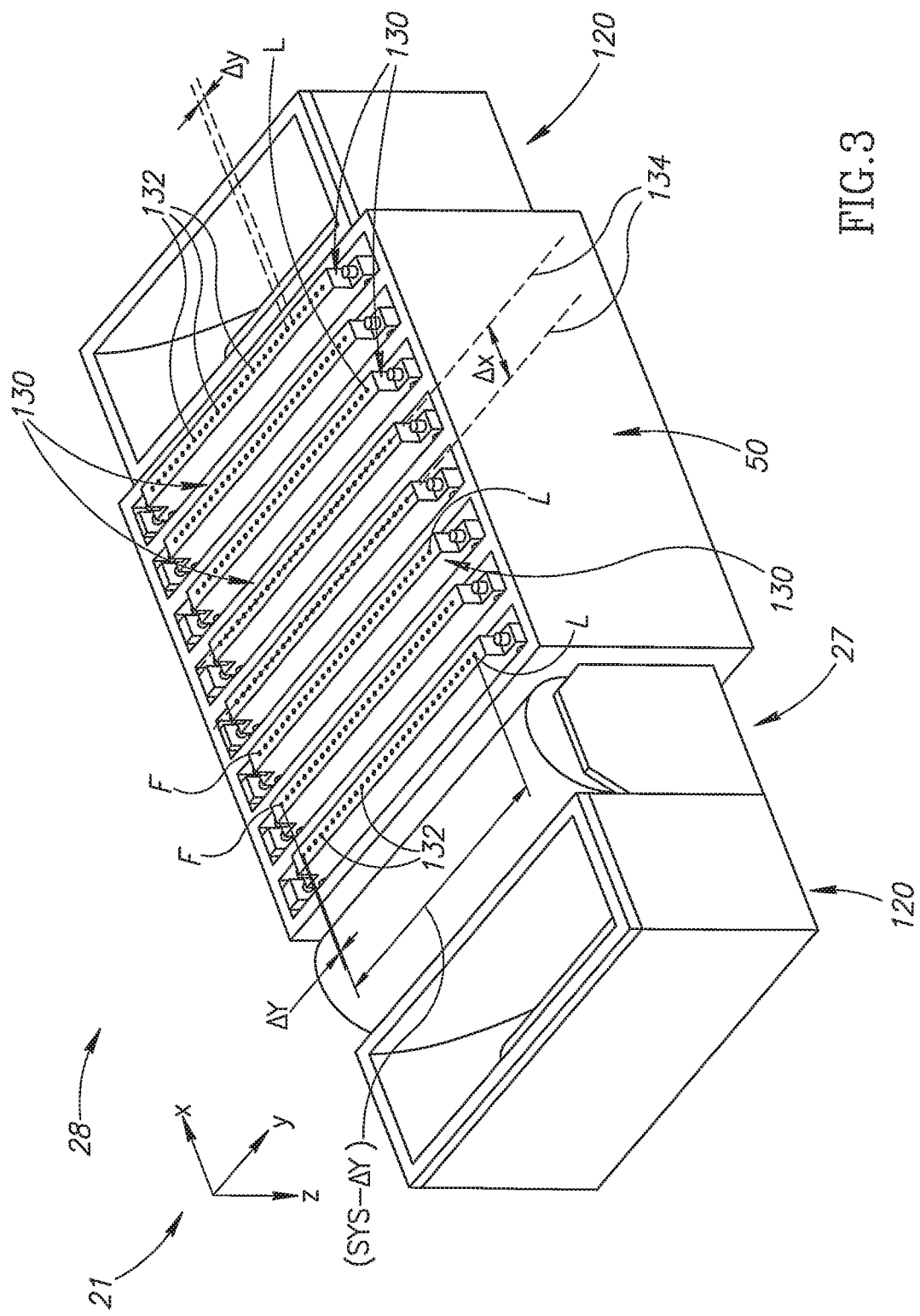
FIG. 3 schematically shows a bottom perspective view of a shuttle, which may be comprised in the RPA shown in FIG. 1A, in accordance with an embodiment of the present invention.

FIG. 3 schematically shows printing head block 50 shown from its underside and a plurality of printing heads 130 mounted to the printing head block. Orientation of printing heads 130 relative to FIG. 1A is indicated by the relative orientation of coordinate system 21, used to provide orientation in FIG. 1, in FIG. 3.

Each printing head 130 is formed having an array of output orifices 132 accurately aligned along a straight line 134. Straight lines 134, hereafter referred to as "printing head axes", along which orifices in a printing head 130 are aligned, are shown for some of the printing heads. A printing head block and printing heads similar to printing head block 50 and printing heads 130 are described in PCT application WO 2004/096527, the disclosure of which is incorporated herein by reference.

For convenience and simplicity of operation of an RPM similar to RPM 20, (FIG. 1), to provide accurate and convenient dispensing of CM, printing head block 50 and its print heads 130 are advantageously mounted in the RPM so that axes 134 are accurately parallel to each other and, optionally, accurately perpendicular to the scan axis which is assumed to be the x-axis. The printing head block is moved along a displacement axis, which is advantageously parallel to the printing head axes 134 and optionally perpendicular to the x-axis, i.e. parallel to the y-axis of coordinate system 21.

Distance, referred to as "x-offset", between adjacent printing head axes 134 is represented by $\Delta x$ and distance, referred to as "inter-orifice y-offset", between output orifices 132 in a same printing head is represented by $\Delta y$. A first orifice 132 in a printing head 130 is an orifice having a smallest y-coordinate and a last orifice in the printing head is an orifice having a largest y-coordinate. First and last orifices 132 for some printing heads 130 are indicated by letters "F" and "L" respectively. Different printing heads 130 are optionally mounted to printing head block 50 displaced one from the other along the y-axis by a "printing head" y-offset $\Delta Y_{ph}$ so that during a scan, homologous printing orifices 132 in different printing heads 130 print along different parallel lines on construction platform 24 (FIG. 1A). Assume that N printing heads 130 mounted to printing head block 50 are used to simultaneously print a same CM. Then $\Delta Y_{ph}=\Delta y/N$.

The x-offset, $\Delta x$, advantageously has a same normative value for any two adjacent printing heads 130. Let an integer index "n" individualize printing heads 130 and have a value that differs by one for adjacent printing heads 130 and an initial value 0 for a first printing head 130, which is, optionally, a printing head having a smallest x-coordinate. Then, if printing head axis 134 of the first printing head 130 has an x-coordinate $x_o$, the printing head axis of an n-th printing head should ideally have an x-coordinate equal to $x_n=x_o+n\Delta x$.

Assume further that each printing head 130 has "M" output orifices 132, and a same normative inter-orifice y-offset $\Delta y$ between adjacent output orifices 132 in the printing head. A distance $M\Delta y$ is referred to as a "shuttle Y-span (SYS)". A distance between the first and last orifice 132 of a printing head 130 is equal to $(SYS-\Delta y)=(M-1) \Delta y$ and is indicated in FIG. 3. If shuttle 28 is properly aligned, a displacement of the shuttle along the y-axis by a distance equal to SYS should result in the first output orifice in the printing head having a y-coordinate greater by $\Delta y$ than the y-coordinate of the last orifice 132 in the printing head prior to the y-axis displacement.

In accordance with an embodiment of the invention, an RPA such as RPA 20 is calibrated to determine if print heads 130 are properly aligned and if not, to undertake procedures for correcting misalignment.

To calibrate RPA 20 so that its print heads 130 are perpendicular to the scan direction, i.e. the x-axis, it is assumed that printing head axes 134 are mounted in printhead block 50 so that their axes 134 are accurately parallel to each other. Any method known in the art, for example a method described in PCT application WO 2004/096527 referenced above, may be used to mount print heads 130 in printing head block 50 so that their axes 134 are accurately parallel. Rotation of printing head axes 130 away from the perpendicular to the x-axis is assumed to result from an unwanted rotation in the position of printing block 50 relative to the x-axis. Or example, as a result of all the printing head axes 134 being skewed relative to the printing head block.

Calibration to align printing head axes 134 perpendicular to the x-axis is performed by printing a first line parallel to the x-axis with an "i-th" orifice in a k-th printing head 130 and a second line parallel to the x-axis with a j-th orifice in an l-th printing head 130. A line parallel to the x-axis may be printed with the i-th orifice by suitably depositing droplets of CM (BM or SM) from the orifice during a scan pass of shuttle 28. If printing heads 130 are properly aligned with their respective axes 134 accurately perpendicular to the x-axis the two printed lines should be separated along the y-axis by a nominal distance "$D_y$"=$|(i-j)\Delta y+(l-k)\Delta Y_{ph}|$. If on the other hand, the separation deviates from the nominal separation, printing head axes 134 are rotated away from the perpendicular to the x-axis. Let the separation between the printed lines be less than (the printed separation can only be less than the nominal distance) the nominal distance by an amount $\delta_y$. Then an angle by which the printing head axes are rotated away from the perpendicular is equal to about $\sqrt{2}\delta_y/D_y$. If $\delta_Y$ is not zero, the orientation of the printing head block is adjusted to reduce or substantially remove the deviation. It is noted that the deviation $\delta_y$ does not indicate whether the angle by which the printing head axes is rotated away from the perpendicular is clockwise or counterclockwise. Determination of the sign of the rotation that gives rise to the deviation may require a trial and error procedure.

Assuming printing head block 50 is oriented so that printing head axes 134 are substantially perpendicular to the x-axis, RPA 20 (FIG. 1A) is calibrated to determine and correct deviation from a normative x-offset spacing $\Delta x$ between printing head axes 134.

To determine if the x-offset between any two, first and second printing heads 130 in RPA 20 is correct, in accordance with an embodiment of the invention, RPA 20 is controlled to print a first straight line parallel to the y-axis with the first printing head 130. A line parallel to the y-axis may be printed by suitably depositing droplets of CM from a plurality of orifices 132 in the printing head. Under the assumption that the x-offset between the printing heads is correct and equal to the normative x-offset spacing $\Delta x$, RPA 20 is then controlled to attempt to print a second straight line collinear with the first line using the second printing head 130. Optionally, the y-axis lines are printed by the first and second print heads during a same scan of shuttle 28 in the x-direction. If the assumption that the x-offset between the printing heads is equal to the normative x-offset spacing $\Delta x$ is correct, the second line will be collinear with the first line. On the other hand, if the assumption is wrong, the first and second printed lines will be displaced one from the other.

If the lines are displaced from each other, optionally, the printing heads 130 are mechanically realigned to correct for the incorrect x-offset spacing. Alternatively or additionally, in accordance with an embodiment of the invention, the incorrect x-offset is compensated for by correcting the relative timing of signals that trigger orifices 132 of the printing heads to dispense CM. The trigger signals are generally provided by suitable encoders and/or step motors that trigger orifices 132 of the printing heads to dispense CM responsive to position of shuttle 28 and assumed x-offset spacings between printing heads 132. To correct x-offset errors, positions of shuttle 28 at which orifices 132 in printing heads are triggered to dispense CM are adjusted so that they dispense CM at their nominal spacings.

For example, assume that an x-offset error in alignment between an i-th and a j-th printing head 130 equal to $e_x$ is to be corrected. Were the printing heads perfectly aligned in the x-direction, for the printing heads to print collinear lines during a same scan of shuttle 28, the j-th printing head would be triggered to print at a position of shuttle 28 along the x-axis that differs from a position of the shuttle at which the i-th printing head prints a line by a "normative displacement distance" equal to (j-i) Δx. To compensate for the x-offset error $e_x$, the encoders and/or step motors and/or processing of signals they provide are adjusted so that the j-th printing head is triggered at a position of shuttle 18 along the scan direction that differs from a position at which the i-th printing head is triggered by a distance, hereinafter a "corrected displacement distance", equal to [(j-i)Δx+$e_x$] rather than the normative displacement distance [(j-i)Δx].

Figure 4A:
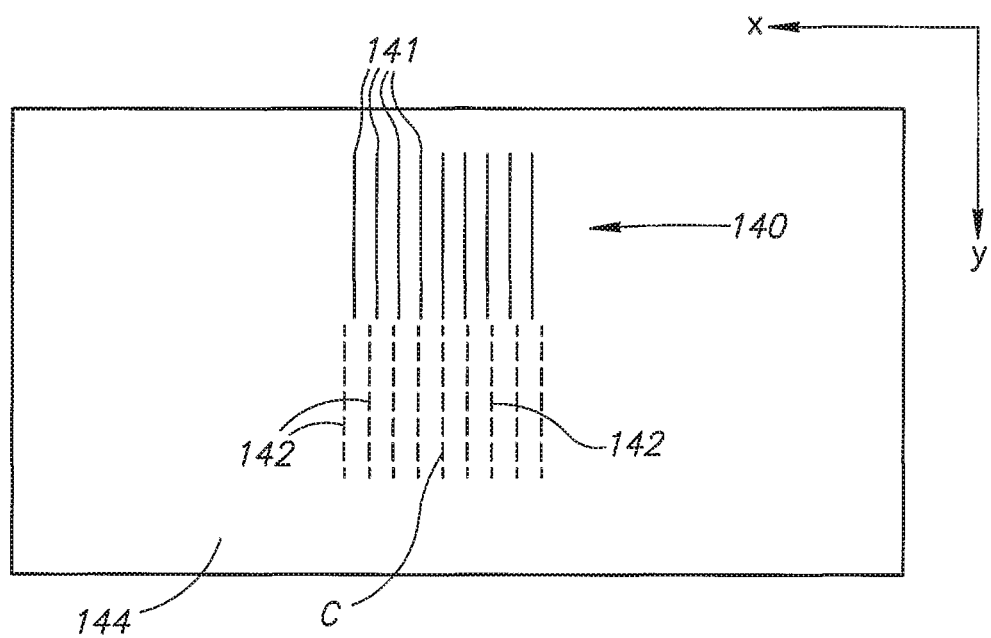
FIGS. 4A-4C schematically show test patterns used to calibrate an RPA, such as the RPA shown in FIG. 1A, in accordance with an embodiment of the invention.

In an embodiment of the invention, to calibrate the x-offset spacings of printing heads 130 in printing block head 50, and determine corrected displacement distances for the printing heads, all the heads are calibrated against a same "standard" head 130. Optionally, the standard head against which the other heads are calibrated is a first head, at one end of the printing head block. For each of the other heads, the controller controls shuttle 28 to print with the standard printing head a set of standard lines parallel to the y-axis. Optionally, the lines are equally spaced. Optionally, the controller controls the shuttle to print a different standard line set for each of the other heads to be calibrated. FIG. 4A schematically shows a set 140 of standard lines 141 printed by the standard printing head to calibrate the x-offset of another, second printing head. Optionally, lines 141 are printed on a transparent substrate 144 to facilitate observing the lines under a microscope.

For each standard line 141 in standard line set 140, shuttle 28 is controlled to print (with the second printing head) a different "calibration" line shown as a dashed line 142 in FIG. 4A parallel to the y-axis. Each calibration line 142 is printed at a different "calibration" displacement distance relative to a position of shuttle 28 at which its corresponding standard line 141 is printed. Optionally, one of the calibration displacement distances is equal to a normative displacement distance (i.e. (j-i)Δx where the i-th printing head is the standard printing head and the j-th printing head is the second printing head) for the standard and second printing heads and each of the other calibration distances differs from the normative displacement distance by a different, small perturbation distance. A corrected calibration distance for the second printing head is determined to be a calibration displacement distance for which a calibration line 142 closest to being collinear with its corresponding standard line 141 is printed by the second printing head 130. In FIG. 4A a calibration line 142 labeled with the letter C is closest to being collinear with its corresponding standard line 141 and the calibration displacement distance at which it is printed is determined to be the corrected displacement distance for the standard and second printing heads 130. It is noted that whereas in FIG. 4A the standard and second printing heads are controlled to print sets of lines, an x-offset spacing calibration, in accordance with an embodiment of the invention can be performed by controlling the printing heads to print "dots", i.e. standard and calibration dots, instead of lines.

In accordance with an embodiment of the invention, it may be useful to calibrate RPA 20 so that the displacement direction of print heads 130 is parallel to printing head axes 134. Two lines are printed at a given x-coordinate with a given printing head 130. The first line is printed on an appropriate substrate by depositing droplets of a CM from a same output orifice 132 as the given printing head 130 is moved along the displacement direction (i.e. optionally the y-direction). This same orifice is preferably one of the lower orifices of the head. After displacing the head substantially SYS along Y, at the same given x-coordinate, a second line is printed with a different orifice 132 of the same printing head by depositing droplets of CM from the orifice as the given printing head 130 is moved along the displacement direction. This same orifice is preferably one of the upper orifices of the head. If the lines are collinear, the displacement direction is parallel to the printing head axes 134 and, optionally, the y-axis. If not, the displacement direction is not parallel to printing head axes 134.

Alternatively, each line is printed by activating all of the orifices at a given x-position. This will result in a line of dots substantially along line 151 of Fig. Then the shuttle is moved in the y-direction by substantially SYS. Again, all the orifices at the same x-position are activated. This produces a line of dots along line 152. Alternatively only few orifices at the lower portion of the head are activated in the first time, and few orifices at the upper portion of the head are activated in the second time.

Figure 4B:
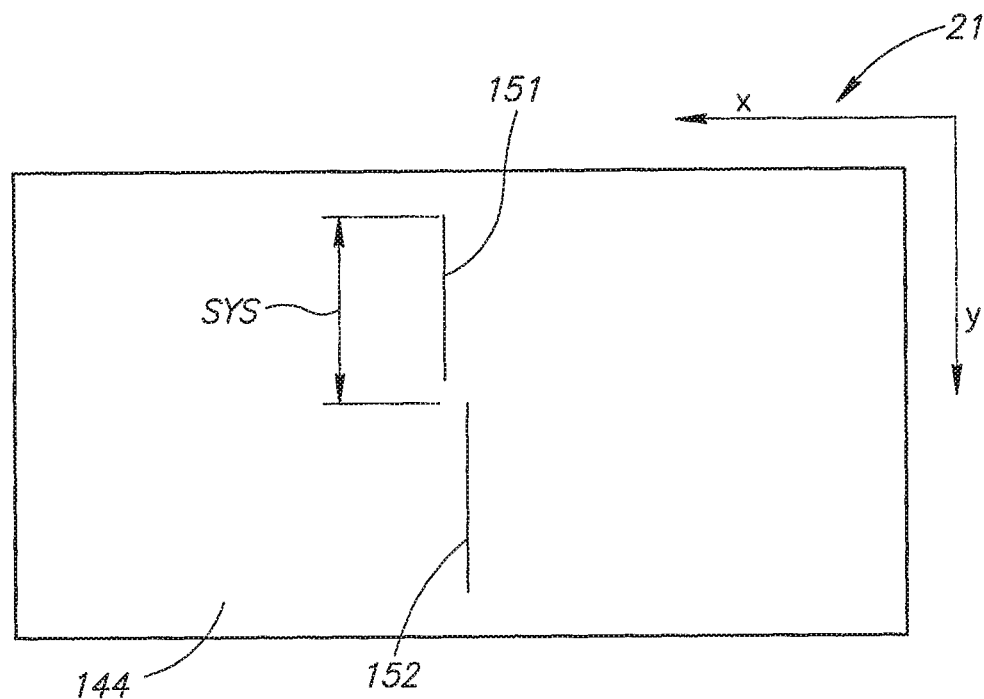

FIG. 4B schematically shows first and second lines 151 and 152 printed using the second method. Line 151 is printed using all of the orifices 132 in a same printing head 130. Then the print head is displaced along the y-axis a distance of approximately SYS. Another line 152 is then printed using all the orifices. If the displacement direction is parallel to printing head axis 134 of the printing head, lines 151 and 152 are collinear. If on the other hand the displacement direction were rotated away from the parallel to the printing head axis 134, lines 151 and 152 would not be collinear.

Figure 4C:
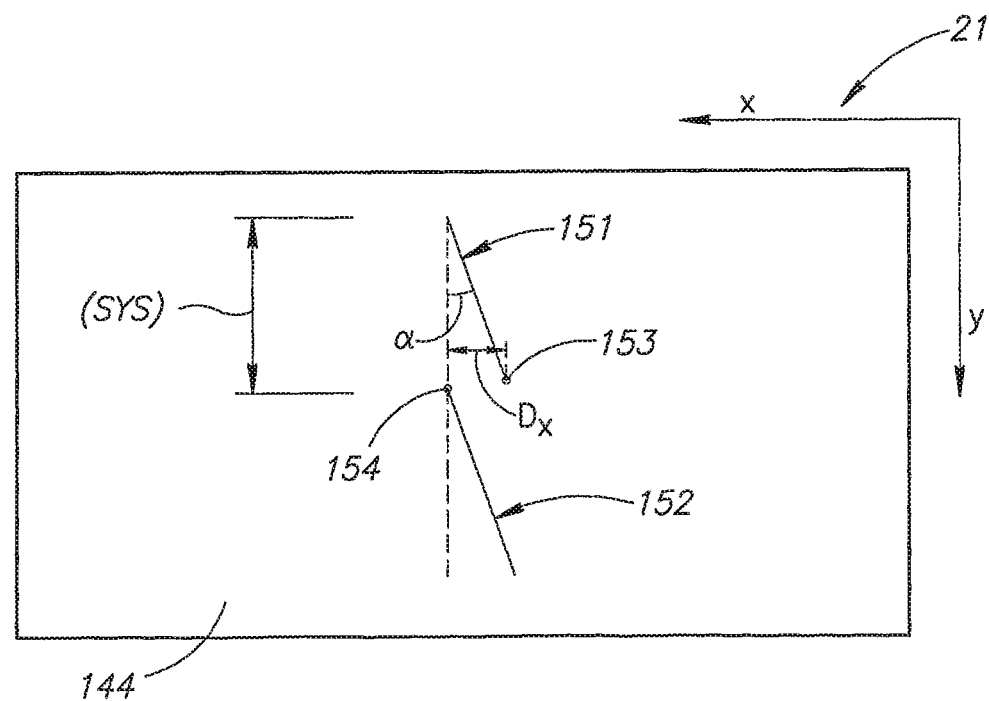

FIG. 4C schematically shows first and second lines 151 and 152 according to the second method, assuming that the displacement direction is rotated away from the parallel to the printing head axis 134 by an angle α. The lower end 153 and upper end 154 of lines 151 and 152 respectively are separated by a distance $D_x$ along the x-axis, and the angle α is approximately equal to $D_x$/SYS assuming a small angle approximation.

For a situation in which the displacement direction is not parallel to the axis 134 of a printing head 130, optionally the relative orientation of the displacement direction vs. head axis 134 is corrected mechanically to reduce the unwanted rotation angle α to substantially zero. Additionally or alternatively, in accordance with an embodiment of the invention, the rotation angle α is compensated for by adjusting relative times at which output orifices 132 in the printing head are controlled to dispense CM.

Though not explicitly stated, it is noted that the above calibration procedure assumes that once printing head axes 134 are aligned perpendicular to the x-axis, aligning the printing head axes parallel to the y-axis, if they are not already so, does not affect their orientation relative to the x-axis. This may depend on how shuttle 28 is mounted in RPA 20. And an order in which the alignment procedures described above are performed may have to take into account how shuttle 28 is coupled to RPA 20.

For example, if the shuttle is constrained to translate along a rail (an "x-rail", which defines a scan direction and thereby an x-axis), once the printing head axes 134 are aligned perpendicular to the x-axis they are substantially fixed in an orientation perpendicular to the x-rail. Printing head axes 134 may then be aligned parallel to a y-axis, i.e. a displacement direction, by orienting the x-rail and y-axis, perpendicular to each other without affecting orientation of the printing head axes relative to the x-axis. (Though, as a result, the x-axis, or the y-axis might change orientation relative to features of RPA 20).

On the other hand, assume shuttle 28 is constrained to translate along a rail, a "y-rail" that defines a y-axis and a displacement direction. If the printing head axes 134 were aligned first perpendicular to a scan direction defined by translation of the y-rail along an x-axis, were the printing head axes not subsequently parallel to the y-axis, aligning the printing head axes parallel to the y-axis would rotate the printing head axes away from the perpendicular to the x-axis. To align printing head axes 134 in this case, the printing head axes should first be aligned parallel to the y-axis.

In order to calibrate RPA 20 so that controller 26 moves shuttle 28 a "correct" distance parallel to the y-axis when it is required to print a construction layer having a "width" along the y-axis greater than the shuttle y-span SYS, the shuttle is controlled to print a line parallel to the x-axis with, optionally, a last orifice 132 (i.e. an orifice labeled L) in a printing head 130. The line is optionally printed on a transparency. Controller 26 then displaces shuttle 28 along the y-axis by a distance equal to SYS and prints another line on the transparency, this time, optionally, using a first orifice 132 (i.e. an orifice labeled F), in the print head. A distance between the lines, optionally checked using a microscope, should be equal to the normative y-offset, $\Delta y$. If the distance differs from $\Delta y$, controller 26 is suitably adjusted to correct for the difference. Adjustment of the controller is generally accomplished by adjusting the controller software. It is noted that in the above calibration procedure, orifices 132 other than a first and a last orifice 132 may be used to print "calibration lines". Depending on the orifices used, a distance between calibration lines may be different than $\Delta Y$.

The above procedure for calibrating RPA 20 so that displacement along the y-axis by a distance SYS results in a displacement of print heads 130 that positions them properly to print construction layers wider than SYS assumes that the distance SYS is a given, equal to $M\Delta y$. However, different objects produced by an RPA such as RPA 20 are often produced at different operating temperatures that result in changes in the dimensions of printing heads 130 from object to object. In addition during cooling of printed CM material the material generally shrinks and the cooled dimensions of a construction layer can be different from the printed dimensions of the layers. To account for these factors, a construction layer having width W is printed at an operating temperature at which an object is to be produced by RPA 20 and the material in the construction layer allowed to cool and measured after cooling. Assuming that the cooled layer has a width W*, displacements along the x and y-axis are adjusted by a scale factor SF=W/W* to compensate for the effects of cooling and operating temperature. Optionally the width W is a largest printable width of RPA 20.

In all (or most of) the calibration methods described above, the lines and dots between which a distance is to be measured, are designed to be very close to each other (less than 5 mm apart, preferably less than 1 mm). This is done in order to minimize errors that may be brought about by expansion or contraction of the substance on which the line or dots are printed (often a plastic transparency, and minimizing accuracy errors of the measurement tool (a microscope or comparator), and enabling the use of simple optical tools having small veining fields (like loops).

Cost of an object produced by an RPA depends upon amounts of material used in producing the object and its production time. Whereas, in general there is little control over an amount of BM required to produce an object because the amount is determined by the object's volume, an amount of SM required to produce the object depends, in general, upon its orientation on the RPAs production platform. Production time is a function inter alia of a number of scan passes, i.e. passes along the scanning x-direction that the shuttle makes in order to produce the object, and the lengths of the scan passes. The number and lengths of the scan passes are functions of orientation and relative position of the objects on the construction platform.

In order to utilize a minimum amount of SM, the orientation of the object is important. This can be understood most easily if it is desired to produce a hollow pyramid, closed on all sides. If the pyramid is produced point down, then support material has to be provided to support all of the side walls and also the wall that is at the top of the pyramid as produced. However, if one of the walls is at the bottom of the object as produced, only the side walls need to be supported. The point down construction requires roughly twice the support material as does the point up construction. Of course, it would be immediately evident, to a person of the art in this situation, that it makes much more sense to construct the object point up. In other situations it is less clear which configuration is best. The following procedure is used, according to some embodiments of the invention, to determine the optimum configuration.

Figure 5A:
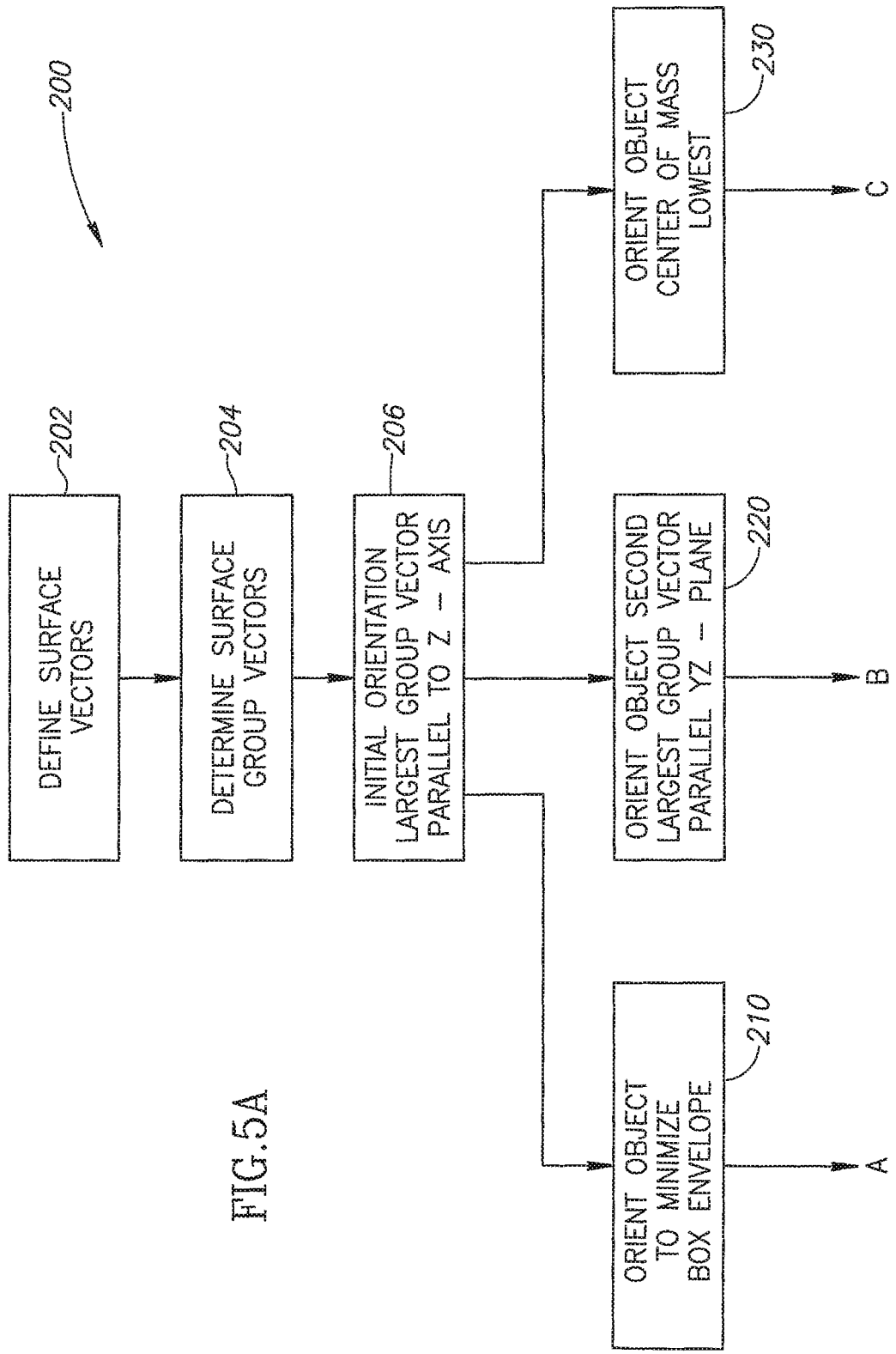
FIGS. 5A and 5B show a flow diagram of a method for determining a build configuration for producing an object that requires a relatively small amount of SM, in accordance with an embodiment of the invention.
Figure 5B:
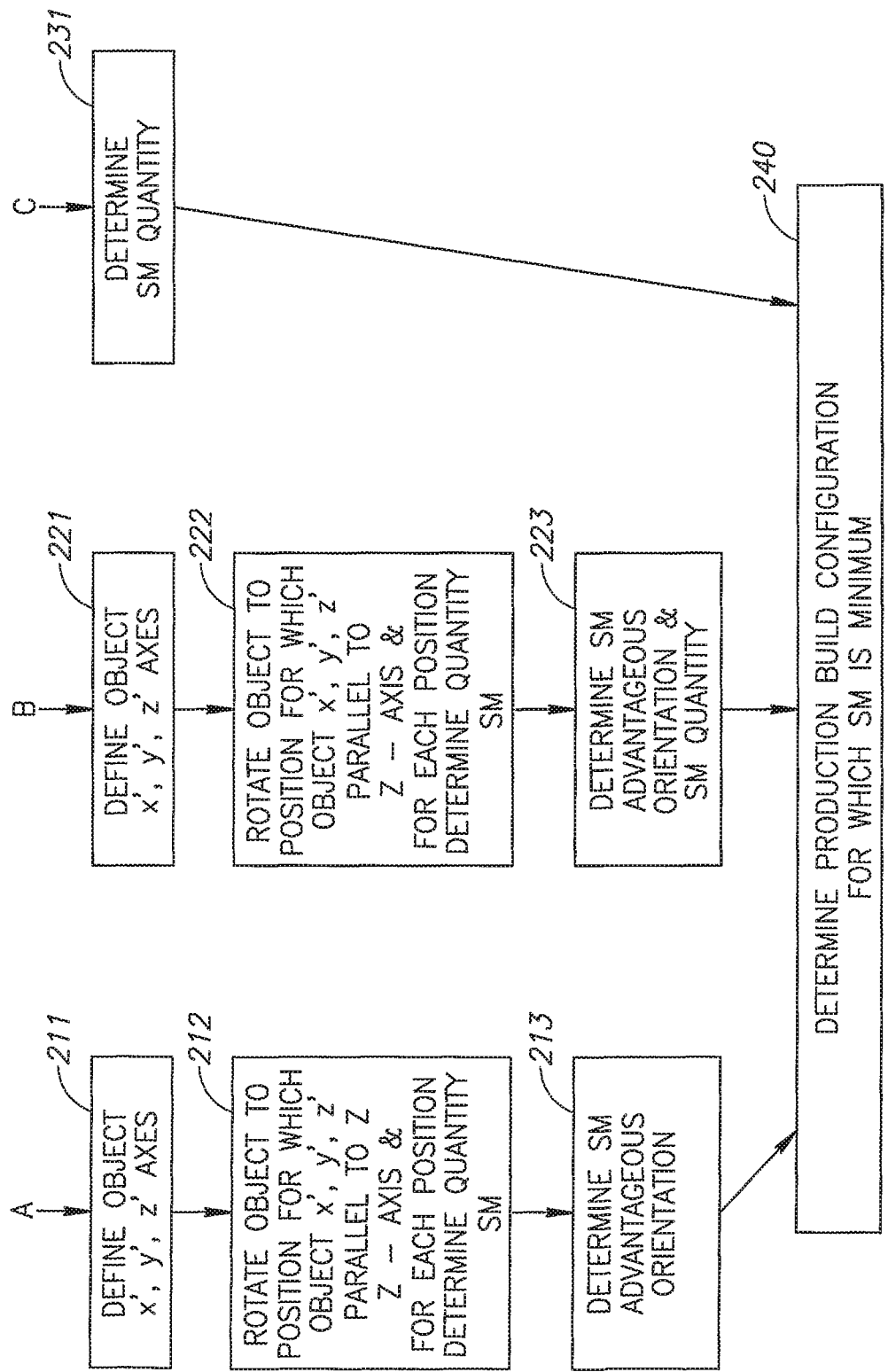

In accordance with an embodiment of the invention, a build configuration that requires a relatively small amount of support material during production of an object is determined in accordance with a method 200 whose acts are shown in FIGS. 5A and 5B. Method 200 is illustrated in FIGS. 6A-6M for an exemplary construction object 190. FIGS. 6A-6M schematically show "virtual images" of the exemplary construction object and construction platform 24 relative to coordinate system 21, shown in FIG. 1A. For each of FIGS. 6A-6M, the corresponding act or acts in method 200 is given in parentheses next to the figure number.

For construction data that defines object 190 and a given initial orientation of the object is provided. At 202 (FIG. 5A) the surface vectors 192 (FIG. 6A) are defined for the construction object. Optionally, surface vectors 192 are defined conventionally. The surface vectors are perpendicular to the surfaces of construction object 190, point outward from its volume and each vector has a size proportional to the area of its corresponding surface. At 204, for each group of vectors 192 that are substantially parallel to a same direction, a "group vector" is defined having a magnitude equal to a sum of the absolute values of all the substantially parallel vectors and a direction that is the same as a direction to which the vectors are substantially parallel. Optionally the surface vectors in a group of vectors that is used to define a group vector are characterized in that an angle between any two vectors in the group is less than a predetermined maximum angle. Optionally the maximum angle is less or equal to about 1°. Optionally, the maximum angle is less than or equal to about 5°.

Figure 6A:
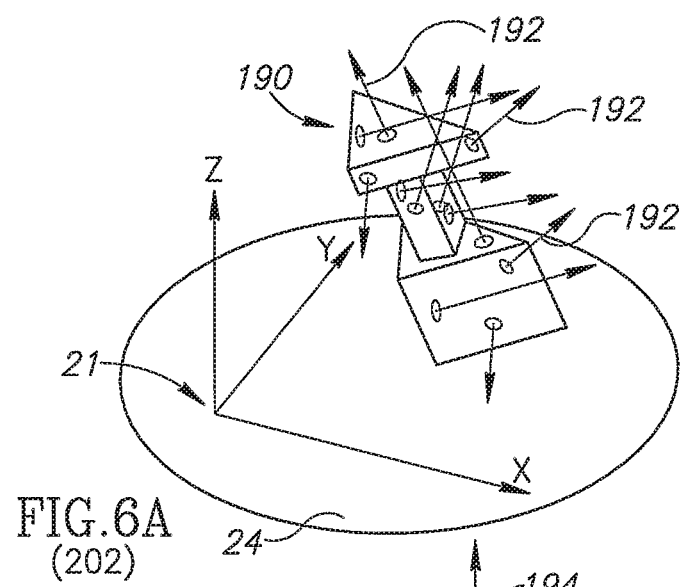
FIGS. 6A-6M schematically illustrate orientations of an object that correspond to and illustrate acts in the method shown in FIGS. 5A and 5B.
Figure 6B:
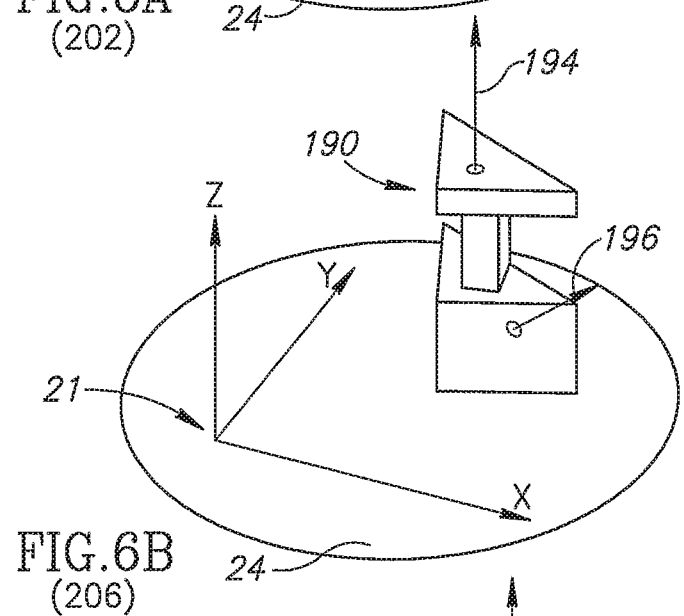

At 206 (FIG. 5A), construction object 190 is oriented so that a largest group vector of the group vectors defined for object 190 is parallel or anti-parallel to the stacking direction i.e. the z-axis. By way of example, FIG. 6B shows object 190 with two group vectors, vectors 194 and 196, determined for the object. Of the group vectors, vector 194 is the largest group vector and object 190 is oriented by method 200 with group vector 194 parallel to the z-axis.

Figure 6C:
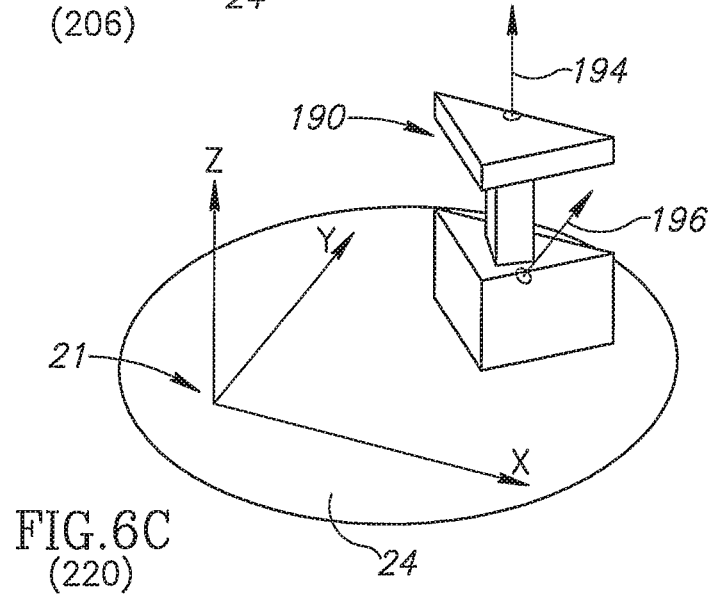

Optionally, at 220, an initial orientation is determined for object 190 by rotating the object about an axis parallel to the z-axis so that a group vector, by way of example group vector 196, having a maximum component perpendicular to the z-axis, is parallel to the y-z plane. FIG. 6C shows object 190 oriented by method 200 so that group vector 196 is parallel to the y-z plane. For the initial orientation established at 220, object x', y', and z'-axes, shown in FIG. 6D, that are parallel respectively to the x, y and z-axes are defined for object 190 at 221. Once determined, the object x', y', and z'-axes are fixed relative to object 190.

Figure 6D:
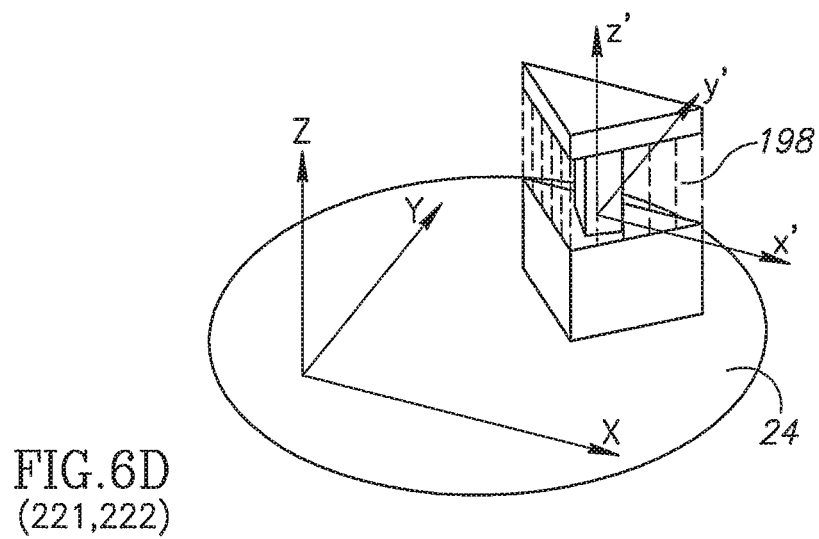
Figure 6E:
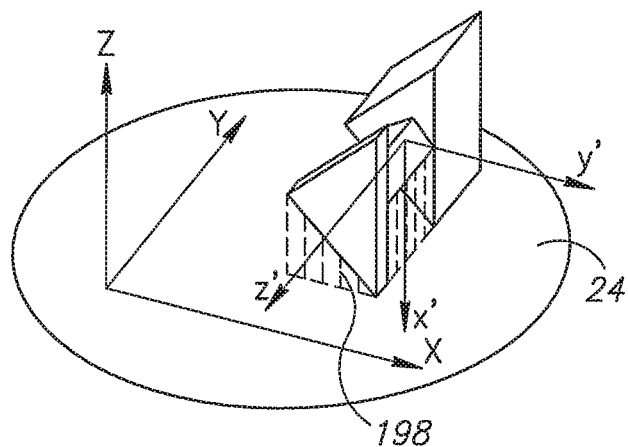
Figure 6F:
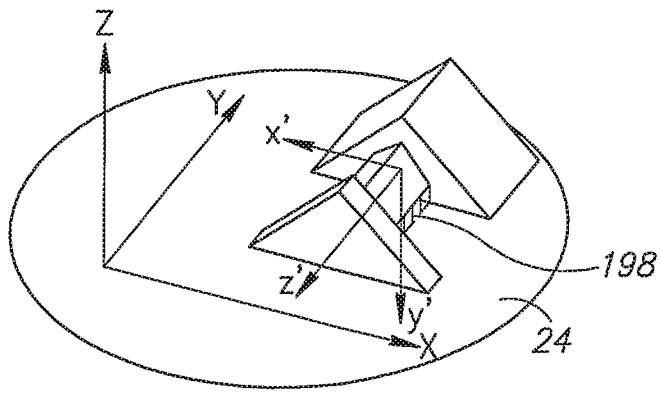
Figure 6G:
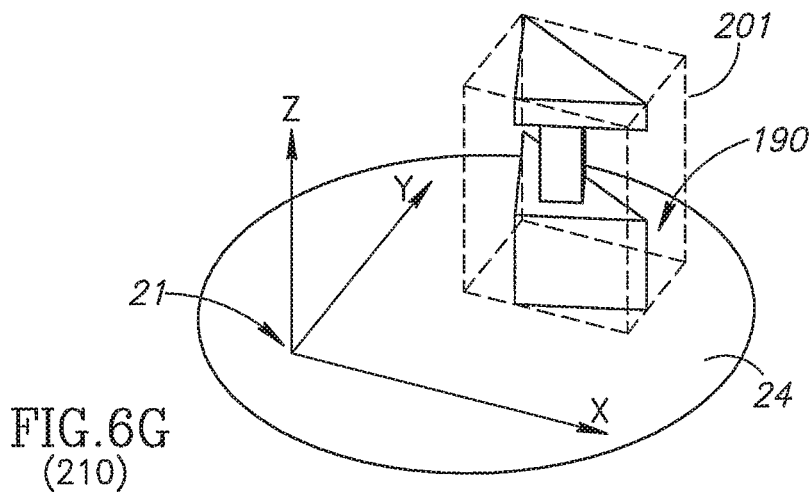

At 222 object 190 is optionally rotated to each orientation for which an object x', y' or z'-axis is parallel or anti-parallel to the z-axis. For each of the orientations, an amount of SM required to produce object 190 is determined. Optionally, a volume $V_{SM}$ of SM required for a given orientation of object 190 is determined by integrating the height of the object in the given orientation over the x-y plane and subtracting the volume of the object. FIGS. 6D, 6E and 6F show orientations in accordance with an embodiment of the invention for which one of the object x', y' or z'-axes is parallel to the z-axis. A shaded area, or areas, 198 in each of the figures schematically indicates where SM material is required to be deposited during construction of object 190. An orientation for which the determined amount of SM is a minimum, is, optionally determined at 223, to be an "SM advantageous orientation". Of the orientations shown in FIGS. 6D-6F, FIG. 6F shows an SM advantageous orientation, for which SM is a minimum.

Optionally, at 223 object 190 is also rotated about an axis parallel to the z-axis so that a group vector of the object having a maximum component perpendicular to the z-axis, is parallel to the y-z plane. While this latter rotation does not change an amount of SM required to produce object 190, it will in general reduce a distance along the y-axis that a shuttle, e.g. shuttle 50 (FIG. 1) has to be displaced to produce the object. Reducing the y-axis displacement in general results in a shorter production time for the object. Methods of reducing production times in accordance with embodiments of the invention are discussed in greater detail below.

Figure 6H:
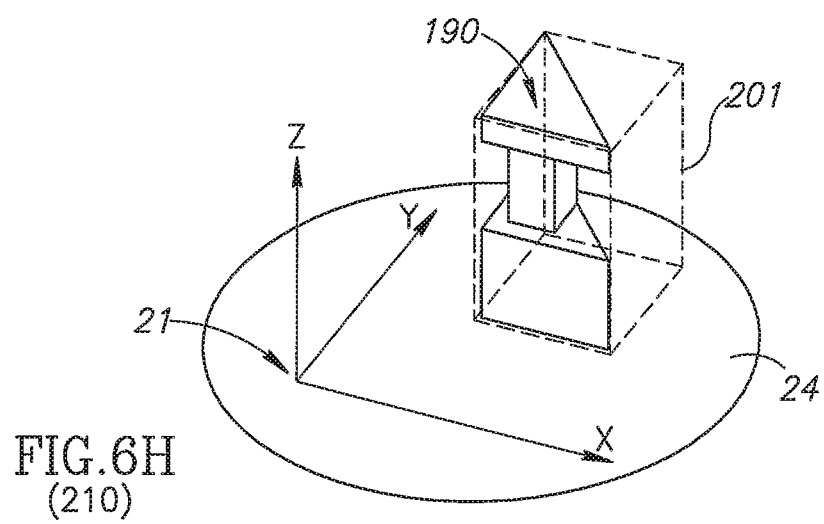
Figure 6I:
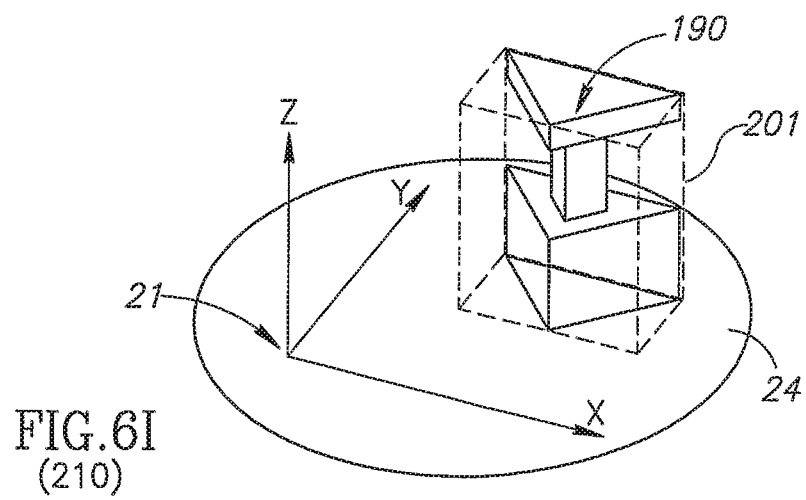

Optionally, in accordance with an embodiment of the invention, an initial orientation for object 190 is also, or alternatively, determined from the orientation determined at 206 differently from the way an initial orientation is determined at 220. At 210, method 200 rotates object 190 about an axis parallel to the z-axis until a volume of an envelope box 201 comprised of x-y, x-z and y-z oriented planes that contains object 190 is minimum. An orientation of object 190 for which envelope box 201 has a minimum volume, and which is therefore, in accordance with an embodiment of the invention, an initial orientation, is shown in FIG. 6H. It is noted that the initial orientation determined at 210 (FIG. 6H) is by way of example, different from that determined at 220 (FIG. 6C).

Figure 6J:
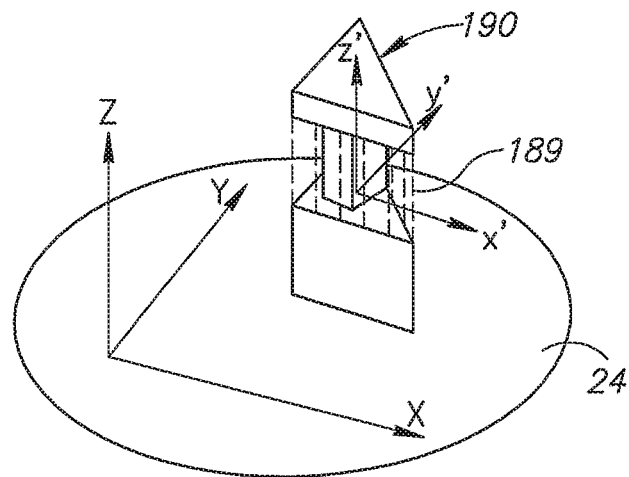
Figure 6K:
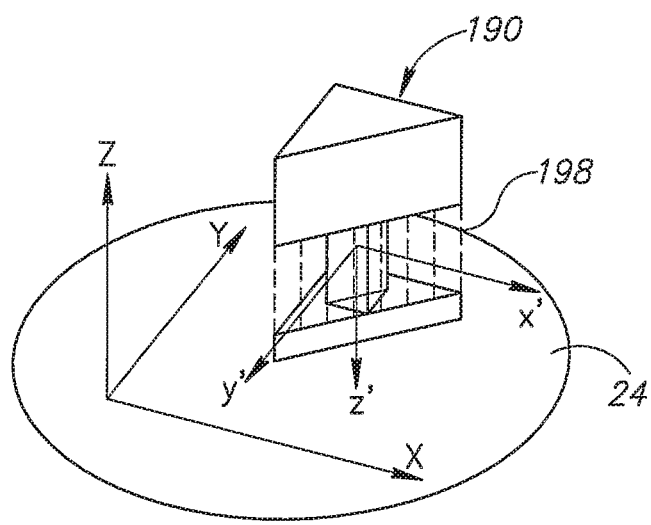
Figure 6L:
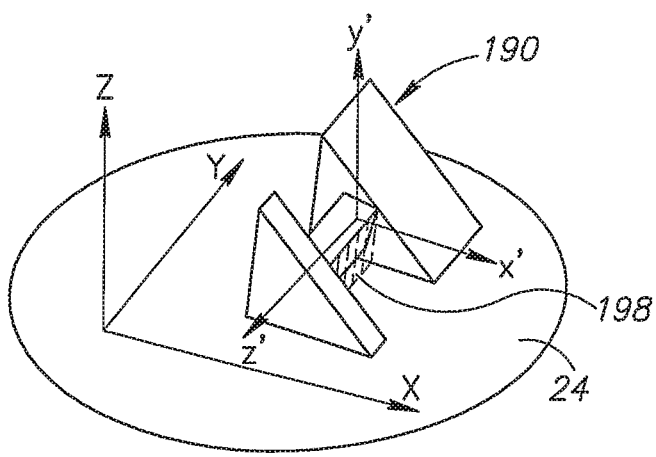

Similarly to the case for the initial orientation determined at 220, at 211 object axes x', y' and z' are determined for the initial orientation determined at 210 (FIG. 6H). Thereafter, at 212, object 190 is optionally rotated into each of the orientations for which an x', y' or z' object axes is parallel or anti-parallel to the z-axis and for each of the orientations an amount of SM required to produce the object is determined. FIGS. 6J, 6K and 6L, show some orientations for which method 200 determines an SM quantity at 212. In the figures regions that require deposition of SM material are indicated by shaded regions 198.

Optionally, at 213, method 200 determines for which of the orientations determined in step 212 the SM quantity is minimum. The orientation for which the amount of SM is a minimum, and which is therefore an SM advantageous orientation, is the orientation shown in FIG. 6L. It is noted that in the specific example shown in FIGS. 6A-6L the different initial orientations determined at 210 and 220 lead to different SM advantageous orientations and that the SM advantageous orientation shown in FIG. 6L is different from that shown in FIG. 6F. Optionally, as at 223, object 190 is rotated at 213 about an axis parallel to the z-axis so that a group vector of object 190 having a maximum component perpendicular to the z-axis, is parallel to the y-z plane.

Figure 6M:
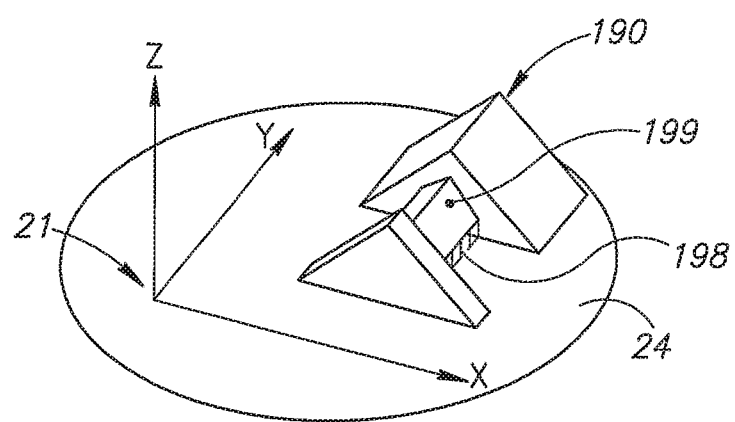

Additionally or alternatively, method 200 optionally determines an SM advantageous orientation at 230. At 230 the method determines that an SM advantageous orientation is that for which a difference in a z-coordinate of the center of mass of object 190 and that of production platform 24 is minimum, i.e. an orientation for which the center of mass of the object is lowest relative to production platform 24. FIG. 6M schematically shows a location 199 of the center of mass of object 190 and an SM advantageous orientation of object 190 for which the center of mass is closest to platform 24. By way of example, for object 190 the lowest center of mass SM advantageous orientation shown in FIG. 6M is the same as the SM advantageous orientation determined at 223 and shown in FIG. 6F. At 231, method 200 optionally determines an amount of SM required to produce object 190 in the lowest center of mass SM advantageous orientation shown in FIG. 6M. And as at 223, object 190 is rotated about an axis parallel to the z-axis at 231 so that a group vector of object 190 having a maximum component perpendicular to the z-axis, is parallel to the yz-plane.

At 240, algorithm 200 optionally compares the quantities of SM required to produce object 190 for each of the SM advantageous orientations (FIGS. 6F, 6L, 6M,) as determined by the algorithm and determines a build configuration for the object to be that SM advantageous orientation for which the SM quantity is a minimum. By way of example, for object 190, the build configuration determined by algorithm 200 is that shown in FIGS. 6F and 6M.

In some embodiments of the invention, following a determination of group vectors for an object, for example as noted at 204 (FIG. 5A), for each group vector, a volume $V_{SM}$ of SM for the object is determined for the group vector parallel to the z-axis and anti-parallel to the z-axis. Optionally, for each orientation of the group vector, $V_{SM}$ is determined as noted above. The group vector and its orientation along the z-axis for which $V_{SM}$ is a minimum is determined to be an advantageous SM orientation.

In some embodiments of the invention, a plurality of axes is defined for an object that intersect at a same internal point of the object. The object is oriented at a plurality of different orientations so that points at which the axes intersect the surface of a sphere having its center at the internal point are homogeneously distributed over the surface of the sphere. For each orientation, a volume $V_{SM}$ of SM required for the orientation is determined. An orientation that has a minimum $V_{SM}$ is determined to be an advantageous SM orientation.

Whereas method 200 determines a build configuration of an object that provides for production of the object using a relatively small amount of SM, and optionally determines an advantageous orientation for production of the object to reduce production time, the method does not indicate how a plurality of objects may be advantageously arranged for production on a construction platform. For situations for which a plurality of objects are to be produced at a same time, the relative positions of the objects on construction platform 24 as well as their orientations, can affect, inter alia, production time of the objects.

A total production scan length for production of a construction object or a plurality of construction objects that are to be simultaneously produced by an RPA is equal to the sum of scan lengths of the scan passes that are required to produce the object or objects. Let an envelope volume be a volume that just envelops the construction object or construction objects. The size and/or orientation of the envelope volume are determined by the orientation and relative position on platform 24 of the object or objects. Often, to an extent that the envelope volume is smaller, the total production scan length is smaller and as a result, the production cost of the object or objects smaller. In addition, for a given total production scan length, to an extent that a number of production scan passes required to produce an object or objects is smaller, the production time, and generally production cost, is smaller. A dimension of the enveloping volume along the displacement direction is proportional to the number of production scan passes. Therefore, generally, to an extent that a dimension of the envelope volume is smaller along the displacement, the production time and cost are smaller.

As discussed above, production time of a layer is a function inter alia of an overall number of scan passes required to produce the object, and the lengths of the scan passes. The number of scan passes has a greater impact on production time than the length of scan passes. This is due to the fact that the head travels a substantial length in X direction prior and after actual printing on the tray, as well as the acceleration/deceleration and Y indexing between scan passes required for each pass. We, therefore, suggest a method that primarily minimizes the number of scan passes. The method would not necessarily lead to the best solution for every case, but would enable reasonable placement in the majority of tray designs.

Optionally, to determine a build configuration for a plurality of objects for production on production platform 24, the objects are ordered in descending order of height (i.e. the dimension in Z direction). The objects are then positioned one after the other on production platform 24 in accordance with their order.

Alternatively, the objects are ordered according to their "Y×Z" figure. "Y×Z" figure is the sum of Y lengths modulus SYS (shuttle Y-span) of all layers along the object's projection on plane Y×Z (See FIGS. 7A and 7B). Y lengths modulus SYS is a measure of the amount of scan passes that are required to dispense the layer.

In some embodiments of the invention, to orient and position a plurality of objects for production on platform 24, each of the objects is optionally oriented so that its projection on the y-z plane is relatively small or substantially a minimum, and the objects are ordered in descending order by height or by "Y×Z" figure. Optionally the orientation of each object is determined in accordance with method 200. It is noted that method 200, optionally rotates an object so that a group vector of the object having a maximum component perpendicular to the z-axis, is parallel to the y-z plane, which generally results in an area of a projection of the object on the y-z plane being a minimum.

Figure 7A:
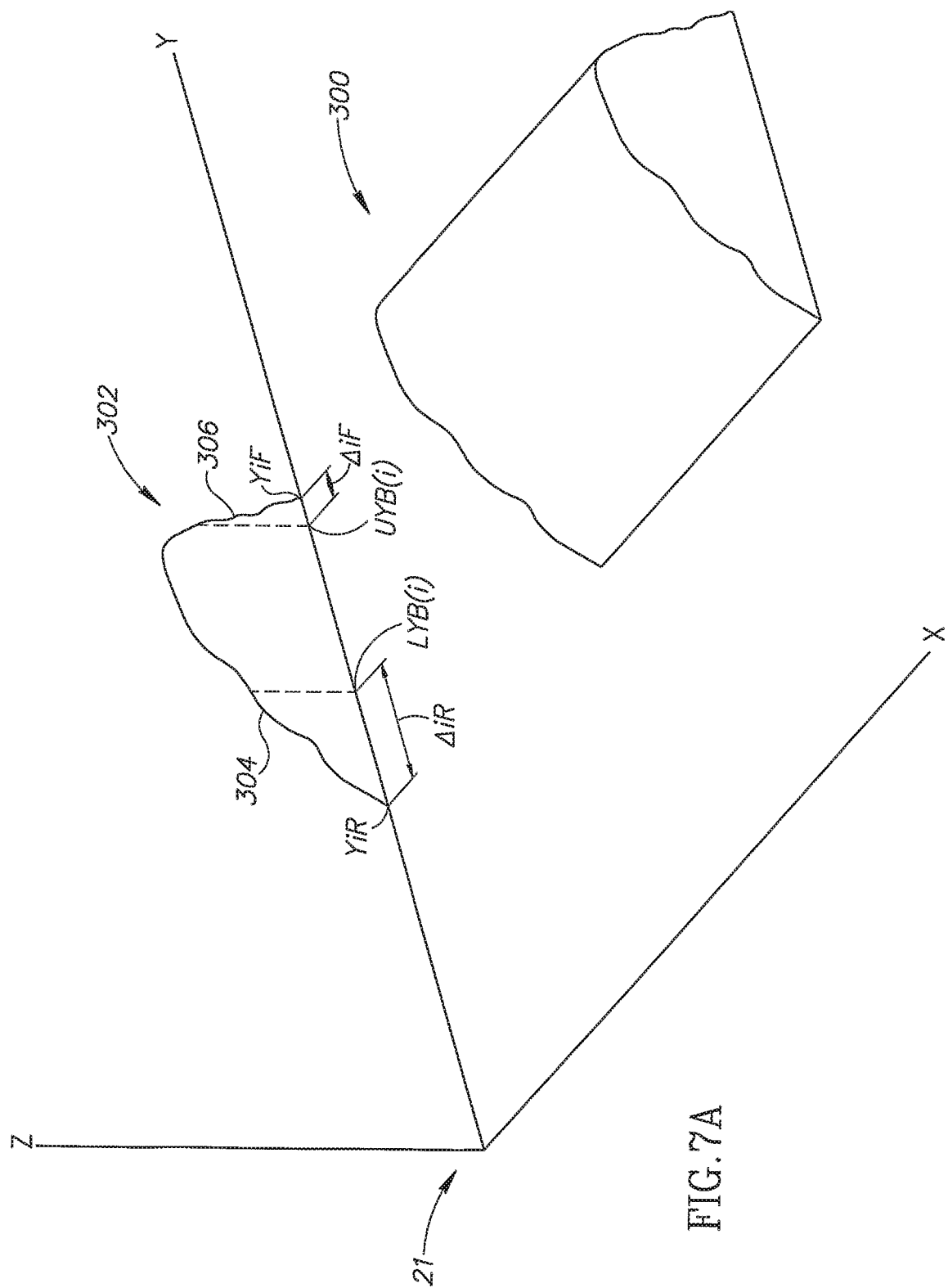
FIGS. 7A and 7B schematically show features of an object that are used in determining a build configuration for a plurality of objects comprising the object, in accordance with an embodiment of the invention.

Let $P_{yz}(i)$ be the projection on the y-z plane of an i-th object of the plurality of objects and let the projection have an external contour characterized by a rising edge and a falling edge. FIG. 7A schematically shows an exemplary i-th object 300 of the plurality of objects at an arbitrary location relative to coordinate system 21 and having a y-z projection 302, characterized by a rising edge 304 and a falling edge 306. Rising edge 304 begins at a first point $y_{iR}$ along the y-axis and falling edge 306 ends at a point $y_{iF}$ ($y_{iF} > y_{iR}$) along the y-axis. Define a lower y-bound (LYB(i)) for the i-th object, e.g. object 300 in FIG. 7A, which is an average value of the y coordinate of the y-z projection $P_{yz}(i)$ over all layers along its rising edge 304. Similarly, define an upper y-bound (UYB(i)) for the i-th object, which is an average value of the y coordinate of the y-z projection $P_{yz}(i)$ along its falling edge 306.

Optionally, in order to increase similarity between the profiles $P_{yz}(i)$ of all parts, each i-th object is oriented in a "preferred orientation" for which, a "rising edge coordinate difference", $\Delta_{iR} = (UYB(i) - y_{iR})$ is less than or equal to a "falling edge coordinate difference" $\Delta_{iF} = (UYB(i) - y_{iF})$. In FIG. 7A object 300 is shown in its preferred orientation.

Figure 7B:
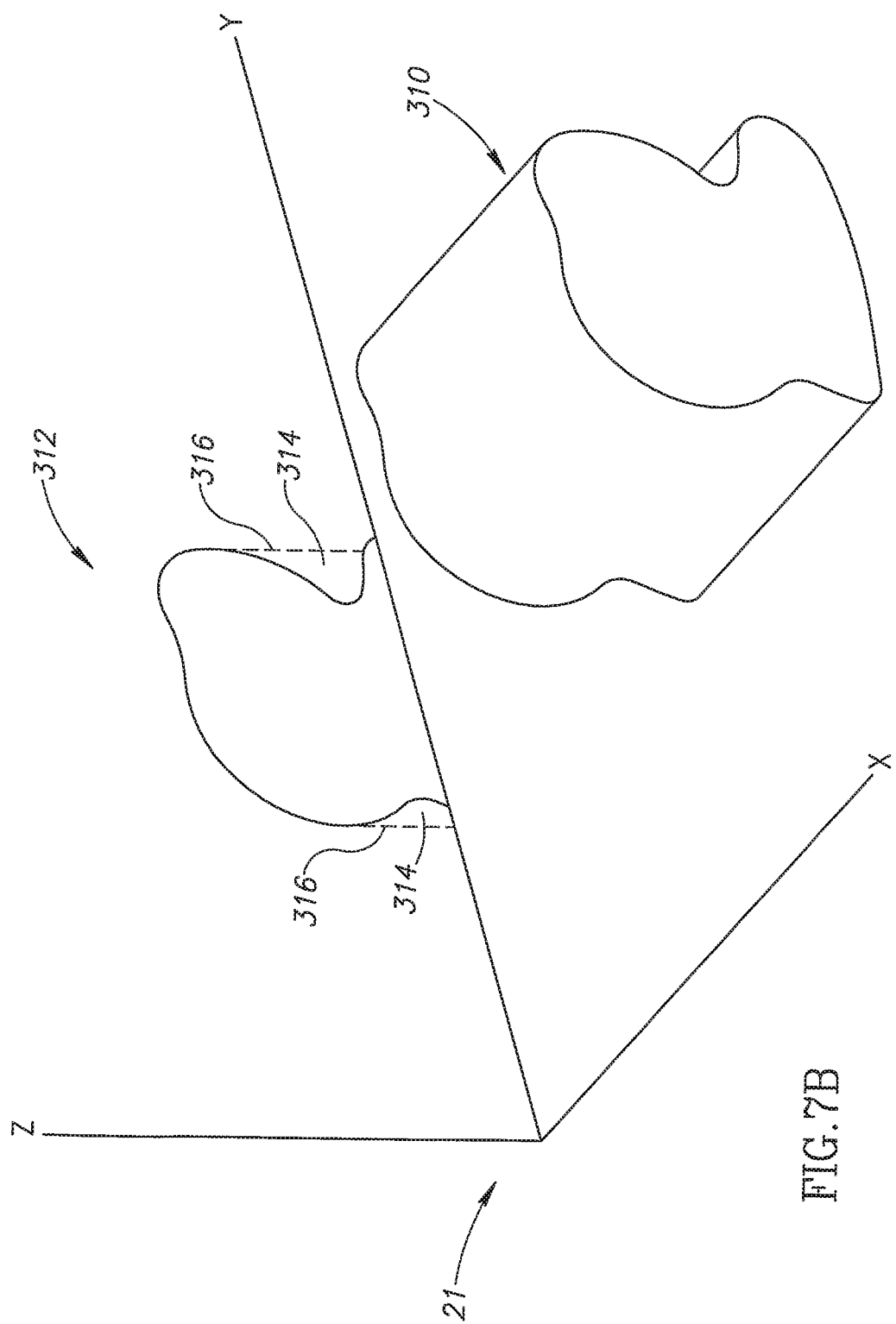
Figure 7C:
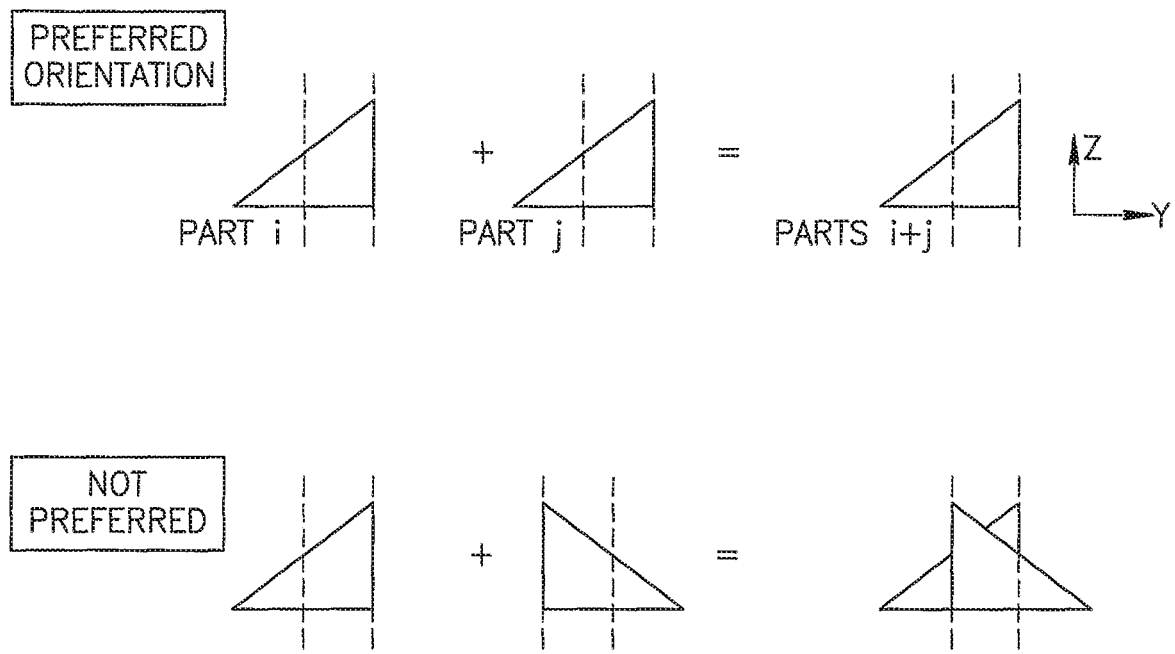
FIG. 7C demonstrates the advantage of increased similarity brought about by "preferred orientation" in reducing the average Y span of two parts, in accordance with an embodiment of the invention.

An example shown in FIG. 7C demonstrates the advantage of increased similarity brought about by "preferred orientation" in reducing the average Y span of two parts (i, j).

In accordance with an embodiment of the invention, if a rising or falling edge of a contour has an undercut, i.e. it is at least double valued for at least some y-coordinates, the contour is modified to remove the undercut by replacing at least a portion of the contour with a line parallel to the z-axis. The lower and upper y-bounds for the object are determined from the rising and falling edges of the modified contour. FIG. 7B schematically shows an i-th object 310 having a y-z projection $P_{yz}(i)$ 312 characterized by undercuts 314. The figure also shows how the projection is modified be replacing portions of its contour with line segments 316, shown dashed, which are parallel to the z-axis to remove the undercuts, in accordance with an embodiment of the invention. The reason for removing the undercuts is that when the supporting structure is added to the objects, the support fills out the undercuts.

To arrange the objects on construction platform 24 in accordance with an embodiment of the invention, the objects are "positioned" on the construction platform in descending order of their height or "Y×Z" figure, while maintaining each object in its preferred orientation. A first object having a greatest height or "Y×Z" figure is first positioned on production platform 24 so that its x-y projection on the platform, i.e. the x-y plane, remains totally within the platform and the x and y-coordinates of the centroid of the x-y projection are minima. The object is thus located in the corner, hereinafter the "starting corner", of the platform 24 having a minimum x value and a minimum y-value.

Thereafter, an i-th object, i>1, is placed on construction platform 24 as follows. A projection on the y-z plane, hereinafter referred to as a "y-z union projection, $UP_{yz}(i-1)$", which is a union of the y-z projections of all (i-1) previously positioned objects and a contour, a "y-z union contour", of the union projection are determined. An x-y union projection, $UP_{xy}(i-1)$ of the x-y projections on the x-y plane of all the (i-1) previously placed object is also determined. It is noted that a union projection $UP_{yz}(i-1)$ of (i-1) objects is the shadow that all the (i-1) objects cast on the y-z plane. Objects or parts thereof that are shadowed by other objects do not contribute to the union projection. Said "y-z union contour" is processed to determine a union lower y-bound, ULYB(i-1), and a union upper y-bound, UUYB(i-1) according to the same method specified before for LYB(i) and UYB(i), with the following exception: The average on minimum (maximum) of y-value of the rising (falling) portion of the contour is performed only up to the full height of the i-th object. A y-span of the union i-IUY SPAN is defined as $$UY\_SPAN(i-1) = UUYB(i-1) - ULYB(i-1).$$

In addition we specify UUYB'(i) and ULYB'(i) in a similar way of UUYB(i) and ULYB(i), with the exception that the average is done up to the height of the i-th object (and not i+1), and $$UY\_SPAN'(i)=UUYB'(i)-ULYB'(i).$$

Optionally, starting from the starting corner of construction platform 24 (for which the x and y-coordinates are minima) the i-th object is then moved along the x-axis, and as required along the y-axis, to determine a smallest x-coordinate and smallest y-coordinate for the object's centroid for which:
  a) its x-y projection $P_{xy}(i)$ does not overlap x-y- union projection $UP_{xy}(i-1)$, i.e. the intersection $UP_{xy}(i-1) \cap P_{xy}(i)=0$; and
  b) the number of printing scans required for the union of the i parts is not larger than that of the i-1 parts. This may be achieved (when possible) by checking that the y-z projections, $UP_{yz}(i-1)$ and $P_{yz}(i)$, substantially include one another up to the height of i-th part, or at least, [UY_SPAN'(i) modulus SYS]=[UY_SPAN(i-1) modulus SYS]

In condition b) above, SYS is the shuttle Y-span defined above and is substantially equal to a widest swath that shuttle 28 can print in single x-scan pass along the x-axis.

The priority of said various requirements are as follows: First: a) and b). Second: x coordinate of the centroid is minimum. Third y coordinate of the centroid is a minimum If a location for the i-th object cannot be found that satisfies conditions a-v, then, if possible, the object is placed on construction platform 24 at a smallest x-coordinate and smallest y-coordinate for which $U_{xy}(i-1) \cap P_{xy}(i)=0$. Alternatively the object is placed where UY_SPAN'(i) modulus SYS is a minimum.

If the latter is not possible, the process described above is repeated in an attempt to place an (i+1)-th object of the plurality of objects on construction platform 24 together with the (i-1) objects already in place. If the process fails again, the process is repeated for the (i+2)-th object and so on until the plurality of objects planned for production on the construction platform is exhausted.

Figure 8:
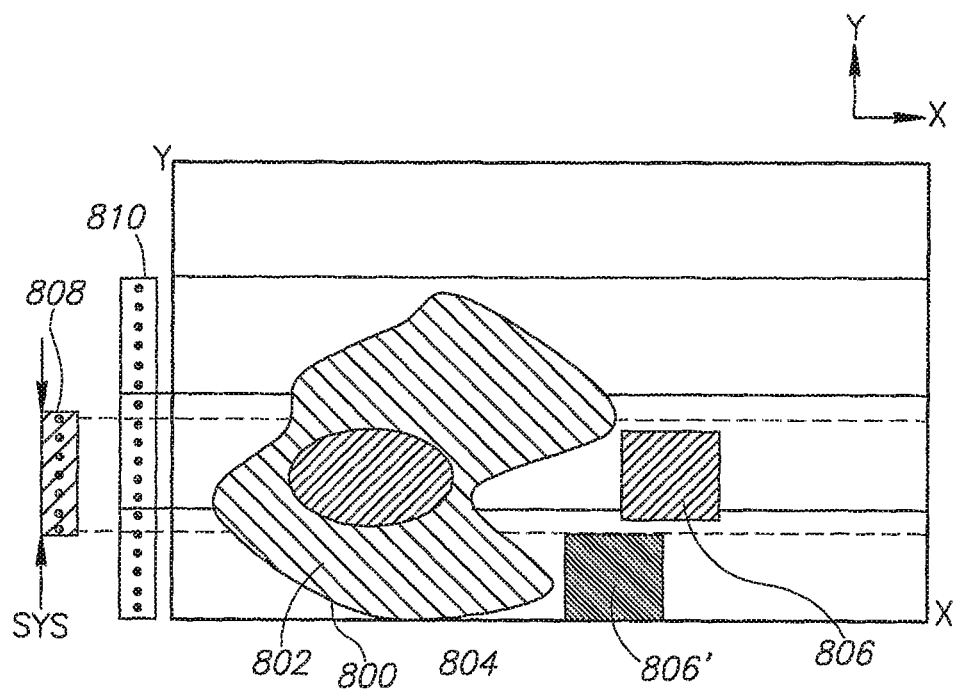
FIGS. 8, 9A and 9B illustrate placement of various height objects in accordance with an embodiment of the invention.

The following examples may demonstrate the advantage of said method:

FIG. 8 shows two parts, a part 800 which is composed of a low portion 802 and a high portion 804, and a part 806 which has only a high portion. Traditionally the placement method optimized placement only according to the projection boundary of the objects on X-Y plane (except for determining the order according to height). The only two criteria were: a. Placing the objects as close to each other as possible; this is in order to minimize scan area, and b. Having the centroid of the projections at as small Y as possible; this is in order to minimize the number of scan passes. The value of Y length of the head (SYS) was disregarded. In addition, traditionally the pass locations in Y direction were fixed. The only variation was that if, at a certain layer, the objects filled an area that was included only in passes from i to j, the passes outside the i to j range were not scanned; but the location of i, . . . j passes remained the same as in the lowest layer. This traditional placement is shown with part 806 indicated by reference 806'.

According to some embodiments of the invention part 806 is placed in the y-z "shadow" of part 800, as indicated by reference 806. In addition, according to this invention, the pass location may vary from layer to layer in response to the object geometry along Y direction, and is optimized for minimum scan time of the layer, which is substantially achieved by minimum number of passes.

The pass location when scanning the high layers is as shown in the figure (dashed horizontal lines). The Y position of the head when scanning the high layers is shown at 808. It is clear from the figure that the number of scan passes when scanning high layers has changed from two scans, according to the traditional method, to a single scan. Note that scanning the lower layers has not changed and is provided by three scan positions indicated as 810.

It is understood that part 806 need not be limited to only a high portion, but that the same principles apply if both parts 800 and 806 have high and low parts. In general, the parts are matched to each other so that a minimum number of (optionally specially positioned) scans are used for the two part ensemble.

Figure 9A:
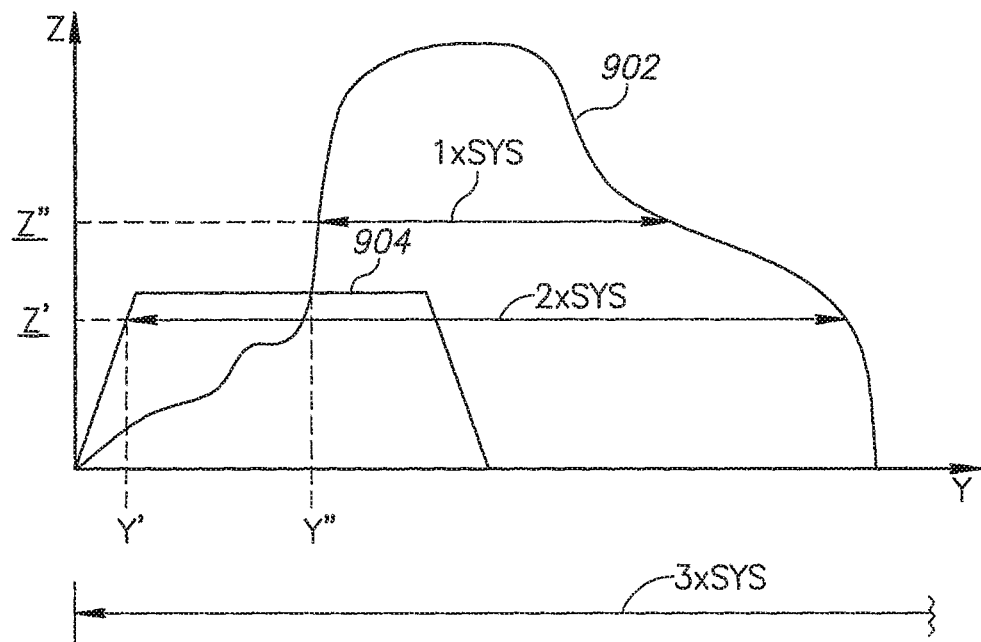
Figure 9B:
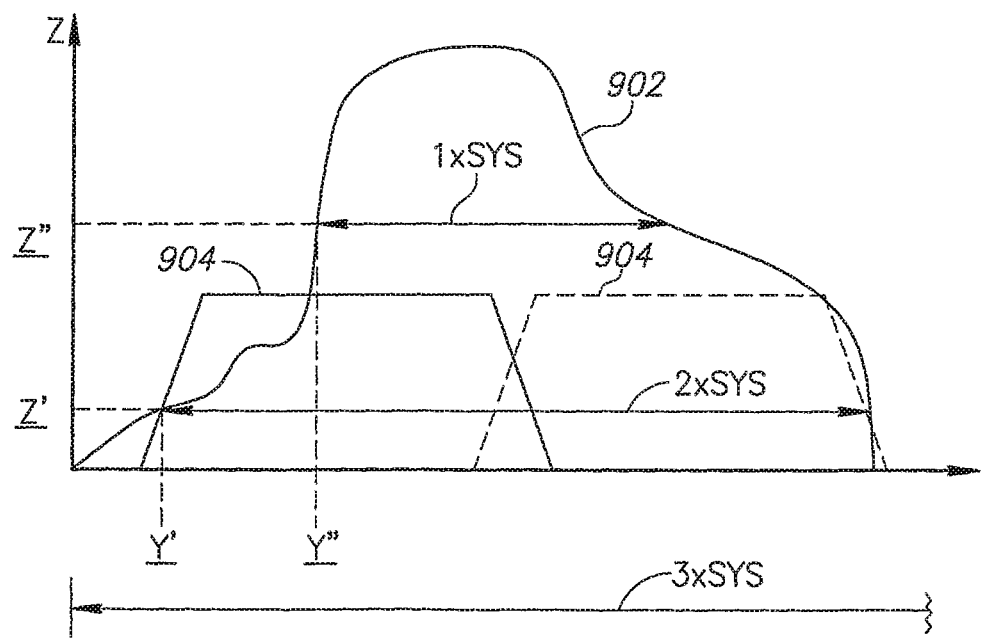

FIGS. 9A and 9B show the y-z union contour 902 of i-1 objects and the y-z contour 904 of the i-th object.

FIG. 9A demonstrates the traditional placement, in which object i is placed at minimum Y value. As a consequence a three pass scan is required substantially for all layers before part i is almost done.

It should be noted that different scan regimes (positioning of the successive scans) may be used for different layers, and that the number of scan regimes is not limited to two such regimes as in the Example of FIG. 8. Thus, depending on the various heights and extents a first scan regime can be used for the lowest layers in this example, a second scan regime can be used for intermediate layers and a third scan regime used for the highest layers.

On the contrary, FIG. 9B demonstrates the placement according to an embodiment of the invention, in which object i 904 is placed substantially within the shadow of the union of preceding objects 902. It is clear from the figure that adding the ith part does not increase the number of passes for producing all parts together, and only two scan passes are required for the majority of layers before part i is done and only a single scan is required for the highest parts of the scan. This is true when we assume that the pass location may vary from layer to layer as discussed above.

It is noted that for the example of FIGS. 9A and 9B, the levels lower than a point indicated by reference Z' are scanned three times, with the first scan originating at Y=0. For the higher parts (up to Z") the starting point for the first scan is at Y=Y'. A third scan regime for even higher portions starts at point=Y"'. This third scan regime includes only a single scan. The positioning of the ith object is not critical, and may very from the illustrated position in FIG. 9B to the right, up to the dashed illustrated position in the figure.

In some embodiments of the invention, an RPA similar to RPA 20 is controllable to operate in a number of different production modes that provide options to produce a same object at different costs and/or production times and/or quality. For each production mode, at least one parameter that affects production, e.g. a parameter that affects production time, and/or quality and/or cost, is set to satisfy a specification of the production mode.

Optionally, the RPA is configured to operate in a production mode selected from a fixed number of preset production mode options, for example a draft, standard and high quality production mode. When a given production mode is selected, the RPA automatically adjusts production parameters to meet the specifications of the production mode. For example, to produce an object in a draft mode, the RPA may configure itself to print relatively thick construction layers, and/or scan along the x-axis at a relatively high speed, and/or reduce the amount of material removed by a planing roller from freshly printed construction layers. Thickness of a construction layer is optionally controlled by controlling a ratio of a rate of deposition of SM and CM material from outlet orifices 132 to a scan velocity of shuttle 28 along the x-axis. Rate deposition is optionally controlled by controlling an orifice injection voltage, or preferably an orifice injection rate. UV power for curing deposited SM and BM and flow rate of air for cooling cured material are adjusted to match the deposition rate and scan velocity. CM temperature also has impact on both injection layer thickness and build quality. The higher the temperature the larger the drop volume and therefore the larger the layer thickness, but the lower the build quality. Therefore CM temperature is also a parameter that is optionally adjusted according to the selected production mode.

Additionally or alternatively, the RPA is optionally configured to enable a user to adjust production parameters to tailor cost, production time and quality to the user's requirements. Optionally the RPA presents an interface to the user displaying value ranges for production parameters that he can adjust to meet the requirements. When a particular value is selected by the user for a given production parameter, the controller adjusts the ranges of parameters whose values remain to be determined, to limit the user's choices for the remaining parameters to values compatible with those already chosen.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A method of printing a three-dimensional object comprising:
    providing a construction material at a first temperature;
    flowing the construction material through a heated flow path in a flow structure to heat the construction material;
    delivering the heated construction material to a printing head;
    dispensing the heated construction material from the printing head to build the three-dimensional object layer by layer; and
    controlling the temperature of the flow structure such that the temperature of the flow structure changes with flow rate to assure the substantial constancy of the temperature of the construction material delivered to the printing head.

2. The method according to claim 1, further comprising controlling the flow rate and the temperature of the flow structure to provide a desired temperature of the heated construction material delivered to the printing head.

3. The method according to claim 1, wherein the temperature and length of the flow structure is high enough so that the temperature of the construction material delivered to the printing head remains substantially constant up to a flow rate of at least 5 gm/sec.

4. The method according to claim 1, wherein the temperature of the construction material delivered to the printing head is controlled to remain substantially constant up to a flow rate of at least 5 gm/sec.

5. The method according to claim 1, wherein the flow path is a channel in a heat sink heated by a heater.

6. The method according to claim 5, wherein the channel is spiral shaped.

7. The method according to claim 1, wherein the flow path is provided as a meandering path at least a portion of which is heated.

8. The method according to claim 1, wherein the flow path is located inside a reservoir in the printing head.

9. The method according to claim 8 wherein the flow path is mounted to the reservoir.

10. An apparatus for printing a three-dimensional object by sequentially printing layers of a construction material one on top of the other, the apparatus comprising:
    a printing block comprising a printing head configured to dispense the construction material;
    a supply system configured to provide the construction material to the printing head;
    a flow structure configured to direct a flow of the construction material from the supply system through a heated flow path;
    a controller; and
    a reservoir in the printing block configured to receive the heated construction material from the flow structure and deliver it to the printing head;
    wherein the printing head is configured to dispense the heated construction material received from the reservoir to print the three-dimensional object layer by layer, and wherein the controller is configured to control the temperature of the flow structure such that the temperature of the flow structure changes with the flow rate of the construction material, to assure the substantial constancy of the temperature of construction material received by the printing head from the reservoir.

11. The apparatus according to claim 10, wherein the controller is configured to control one or more of the flow rate and the temperature of the flow structure to provide a desired temperature of the construction material in the reservoir.

12. The apparatus according to claim 10, wherein the temperature and length of the flow structure is defined to be high enough so that the temperature of the construction material delivered by the reservoir to the printing head remains substantially constant up to a flow rate of at least 5 gm/sec.

13. The apparatus according to claim 10, wherein the controller is configured to maintain the temperature of the construction material delivered by the reservoir to the printing head substantially constant up to a flow rate of at least 5 gm/sec.

14. The apparatus according to claim 10, wherein the flow path is a channel in a heat sink heated by a heater.

15. The apparatus according to claim 14, wherein the channel is spiral shaped.

16. The apparatus according to claim 10, wherein the flow path is a meandering path, at least a portion of which is heated.

17. The apparatus according to claim 10, wherein the flow path is located inside the reservoir or is mounted to the reservoir.

\* \* \* \* \*